United States Patent
Yoshida et al.

(10) Patent No.: US 9,019,593 B2
(45) Date of Patent: Apr. 28, 2015

(54) OPTICAL AMPLIFICATION APPARATUS

(75) Inventors: Setsuo Yoshida, Kawasaki (JP); Susumu Kinoshita, Kawasaki (JP); George Ishikawa, Kawasaki (JP); Goji Nakagawa, Kawasaki (JP); Yutaka Kai, Kawasaki (JP); Kyosuke Sone, Kawasaki (JP); Keisuke Harada, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 173 days.

(21) Appl. No.: 13/417,481

(22) Filed: Mar. 12, 2012

(65) Prior Publication Data

US 2012/0257272 A1     Oct. 11, 2012

(30) Foreign Application Priority Data

Apr. 11, 2011   (JP) .................................. 2011-086898

(51) Int. Cl.
*H01S 5/06* (2006.01)
*H04B 10/291* (2013.01)
*H01S 5/50* (2006.01)
*H04B 10/12* (2006.01)
*H01S 5/00* (2006.01)
*H01S 5/042* (2006.01)
(Continued)

(52) U.S. Cl.
CPC .......... *H04B 10/2914* (2013.01); *H01S 2301/06* (2013.01); *H01S 5/0078* (2013.01); *H01S 5/0428* (2013.01); *H01S 5/06216* (2013.01); *H01S 5/06835* (2013.01); *H01S 5/4087* (2013.01); *H01S 5/5027* (2013.01); *H01S 2301/04* (2013.01)

(58) Field of Classification Search
CPC  H01S 5/4087; H01S 5/06835; H01S 2301/06
USPC ........................................................ 359/344
See application file for complete search history.

(56) References Cited

U.S. PATENT DOCUMENTS 6,714,345 B2 *   3/2004   Traynor ........................ 359/344
7,446,933 B2   11/2008   Iannone et al.
(Continued)

FOREIGN PATENT DOCUMENTS

JP     2007-006500     1/2007
JP     2009-055550     3/2009
(Continued)

OTHER PUBLICATIONS

Yasuo Kokubun, Advanced Optical Electronics IV "Optical Wave Engineering", Jun. 10, 1999, pp. 262-263.

*Primary Examiner* — Eric Bolda
(74) *Attorney, Agent, or Firm* — Fujitsu Patent Center

(57) ABSTRACT

An optical amplification apparatus includes a front-stage semiconductor optical amplifier which amplifies an input light and a rear-stage semiconductor optical amplifier which amplifies an amplified light outputted from the front-stage semiconductor optical amplifier. The front-stage semiconductor optical amplifier exercises auto level control of an output light by exercising variable control of driving current which flows according to applied voltage higher than light emitting threshold voltage of an internal optical amplification element. The rear-stage semiconductor optical amplifier performs gate switching of a transmitted light by exercising switching control of driving current. By doing so, distortion of a waveform is controlled and optical communication quality can be improved.

7 Claims, 23 Drawing Sheets

(51) Int. Cl.
*H01S 5/062* (2006.01)
*H01S 5/0683* (2006.01)
*H01S 5/40* (2006.01)

(56) References Cited

U.S. PATENT DOCUMENTS 7,738,164 B2 * 6/2010 Iannone et al. ............... 359/334
7,898,341 B2   3/2011 Ueno et al.
8,259,390 B2 * 9/2012 Hoshi et al. .................. 359/344
2009/0058534 A1 * 3/2009 Ueno et al. .................... 330/302
2009/0208227 A1   8/2009 Yoshida et al.
2010/0208335 A1   8/2010 Yoshida
2010/0321768 A1 * 12/2010 Sone ............................. 359/337
2011/0116803 A1 * 5/2011 Sone et al. ...................... 398/98

FOREIGN PATENT DOCUMENTS

JP   2009-200633   9/2009
JP   2010-186919   8/2010

* cited by examiner

OPTICAL AMPLIFICATION APPARATUS

CROSS-REFERENCE TO RELATED APPLICATION

This application is based upon and claims the benefit of priority of the prior Japanese Patent Application No. 2011-086898, filed on Apr. 11, 2011, the entire contents of which are incorporated herein by reference.

FIELD

The embodiments discussed herein are related to an optical amplification apparatus for performing optical amplification.

BACKGROUND

In recent years, the use of a long-distance large-capacity optical communication network has spread and the development of high-speed large-capacity WDM (Wavelength Division Multiplex) transmission systems has progressed.

In addition, attention is paid to SOAs (Semiconductor Optical Amplifiers) which change the gain according to driving current as optical amplifiers in optical communication networks.

An SOA is an optical amplifier including an optical amplification element made from a compound semiconductor such as indium phosphorus (InP). Compared with EDFAs (Erbium Doped Fiber Amplifiers) using an erbium (Er) doped fiber as an amplification medium, SOAs are, for example, small and have wide amplification bands. SOAs have these advantages, so they have come to be widely applied to optical communication networks.

The following techniques regarding optical amplification control by an SOA were proposed as prior arts.

Japanese Laid-open Patent Publication No. 2009-200633
Japanese Laid-open Patent Publication No. 2010-186919

In order to reduce a time delay in the flowing of driving current to an SOA chip after the generation of applied voltage, an edge enhancement is performed on the applied voltage at the time of optical amplification by an SOA. However, there may be a change in the power of a light inputted to the SOA. In this case, performing an edge enhancement the size of which is fixed on applied voltage without taking the change into consideration causes distortion of the waveform of an amplified light outputted from the SOA.

SUMMARY

According to an aspect of the invention, there is provided an optical amplification apparatus including a front-stage semiconductor optical amplifier which amplifies an input light and a rear-stage semiconductor optical amplifier which amplifies an amplified light outputted from the front-stage semiconductor optical amplifier, the front-stage semiconductor optical amplifier exercising auto level control of an output light by exercising variable control of driving current which flows according to applied voltage higher than light emitting threshold voltage of an internal optical amplification element, the rear-stage semiconductor optical amplifier performing gate switching of a transmitted light by exercising switching control of driving current.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
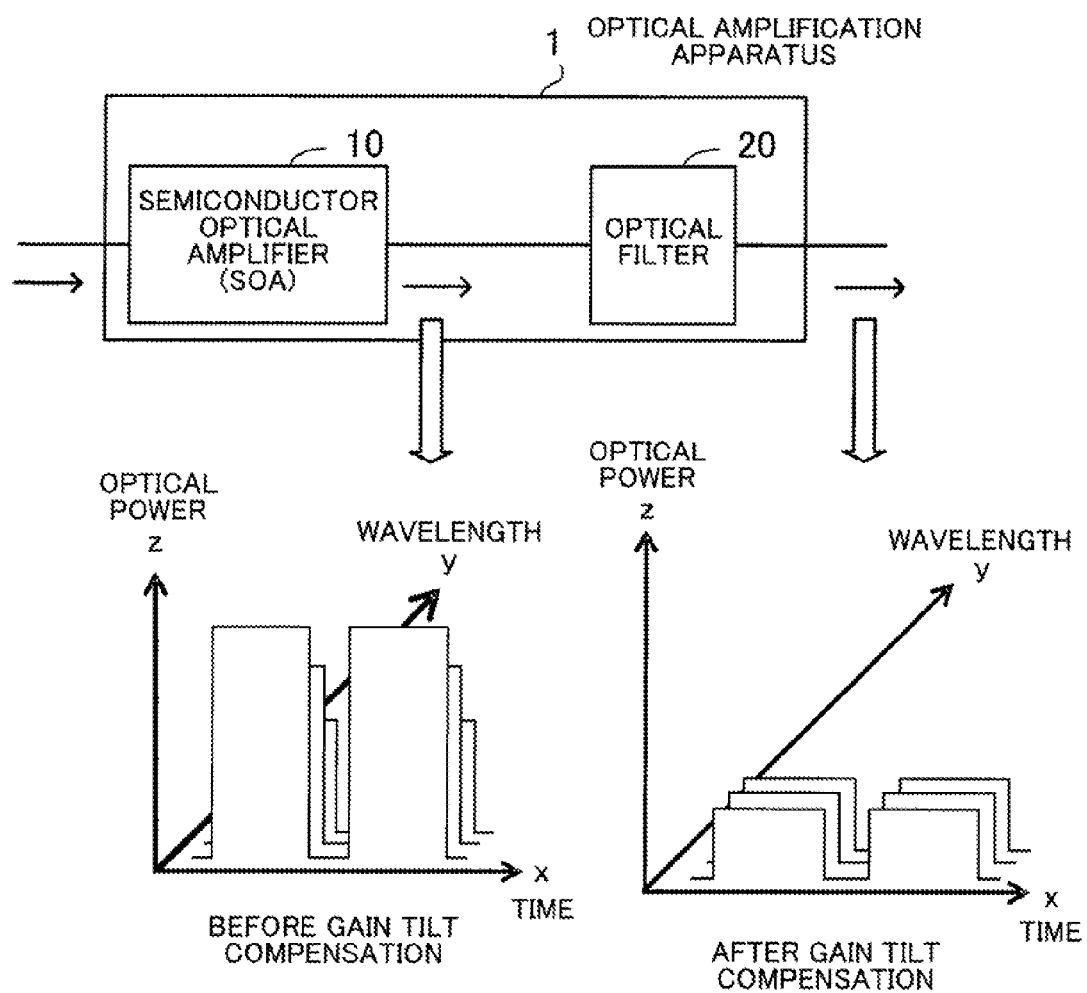
FIG. 1 is an example of the structure of an optical amplification apparatus.

Embodiments of the present invention will now be described with reference to the accompanying drawings, wherein like reference numerals refer to like elements throughout. FIG. 1 is an example of the structure of an optical amplification apparatus. An optical amplification apparatus 1 includes a semiconductor optical amplifier (SOA) 10 and an optical filter 20.

The SOA 10 amplifies an input light. The optical filter 20 performs filtering of an output light outputted from the SOA 10. The optical filter 20 has a transmission characteristic which compensates for a gain tilt in a wavelength direction that occurs at the time of the SOA 10 exercising auto level control (ALC) of the output light in the case of the input light being a WDM signal light. The optical filter 20 performs optical filtering by this transmission characteristic.

In FIG. 1, an x-axis indicates time, a y-axis indicates a wavelength, and a z-axis indicates optical power. A WDM signal light before gain tilt compensation is indicated as the state of input to the optical filter 20 and a WDM signal light after gain tilt compensation is indicated as the state of output from the optical filter (details will be described later).

Figure 2:
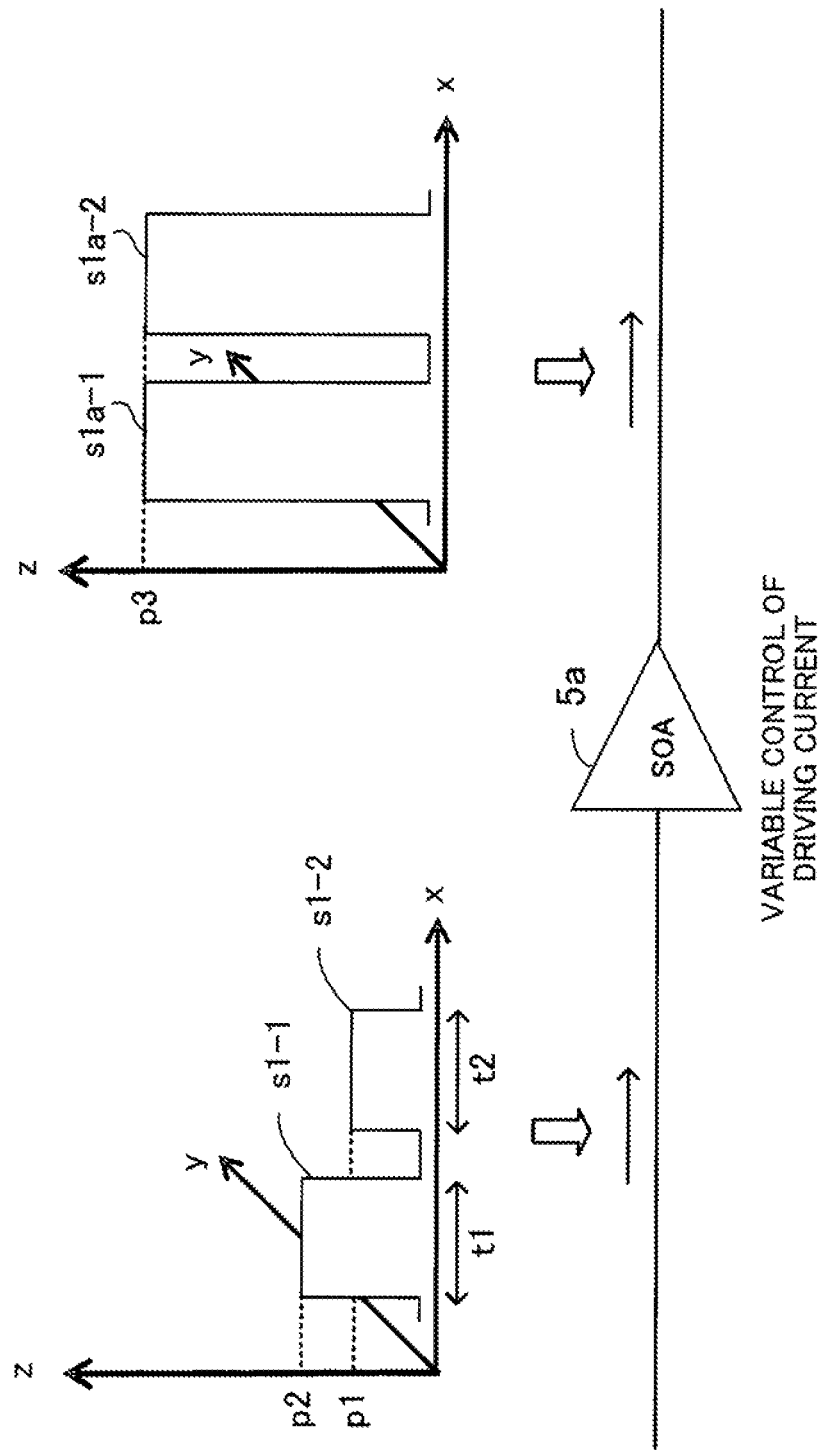
FIG. 2 illustrates a state in which a signal light with one wavelength is amplified.

Power deviation among wavelengths caused by a gain tilt at the time of amplification of a WDM signal light by ALC by an SOA will now be described. FIG. 2 illustrates a state in which a signal light with one wavelength is amplified. In FIG. 2, an x-axis indicates time, a y-axis indicates a wavelength, and a z-axis indicates optical power.

An optical packet signal with one wavelength ($\lambda$1) is inputted to an SOA 5a. It is assumed that at time t1 an optical packet signal s1-1 with the wavelength $\lambda$1 having optical power p2 is inputted and that at time t2 an optical packet signal s1-2 with the wavelength $\lambda$1 having optical power p1 is inputted.

It is assumed that the SOA 5a exercises ALC of these input signals to amplify them with output light levels constant. Driving current for the SOA 5a is set to different values at the time t1 and the time t2. By doing so, the gain is set according to the optical power p1 and optical power p2 to make the levels of the optical packet signals s1-1 and s1-2 after amplification constant. As a result, optical packet signals s1a-1 and s1a-2 each having same optical power (same optical peak power) p3 are outputted from the SOA 5a.

Figure 3:
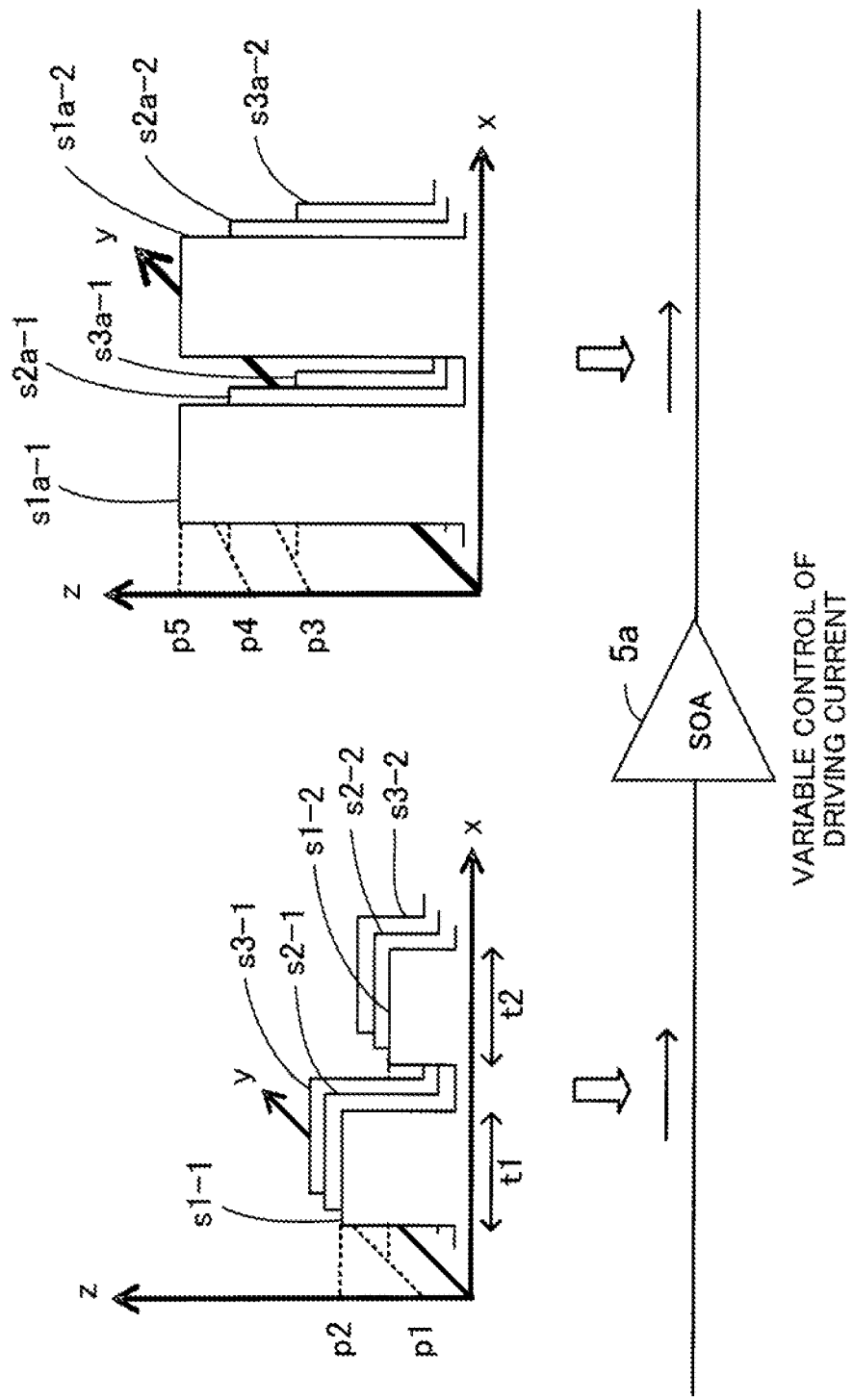
FIG. 3 illustrates a state in which power deviation among wavelengths is caused by a gain tilt.

FIG. 3 illustrates a state in which power deviation among wavelengths is caused by a gain tilt. In FIG. 3, an x-axis indicates time, a y-axis indicates a wavelength, and a z-axis indicates optical power. FIG. 3 illustrates a state in which a WDM signal light inputted to the SOA 5a is amplified by ALC.

A WDM optical packet signal in which optical packet signals with wavelengths $\lambda$1, $\lambda$2, and $\lambda$3 ($\lambda$1<$\lambda$2<$\lambda$3) are combined is inputted to the SOA 5a. It is assumed that at time t1 optical packet signals s1-1 through s3-1 with the wavelengths $\lambda$1 through $\lambda$3 each having optical power p2 are inputted and that at time t2 optical packet signals s1-2 through s3-2 with the wavelengths $\lambda$1 through $\lambda$3 each having optical power p1 are inputted.

The SOA 5a exercises ALC of these input signals by setting driving current to different values at the time t1 and the time t2. This is the same in FIG. 2. As a result, the optical power of lights outputted from the SOA 5a is constant with respect to wavelengths in the time direction (x-axis direction). However, the optical power of the lights outputted from the SOA 5a is not constant in the wavelength direction (y-axis direction).

That is to say, each of optical packet signals s1a-1 and s1a-2 with the wavelength $\lambda$1 has same optical power p5 in the time direction and is outputted from the SOA 5a. In addition, each of optical packet signals s2a-1 and s2a-2 with the wavelength $\lambda$2 has same optical power p4 in the time direction and is outputted from the SOA 5a. Furthermore, each of optical packet signals s3a-1 and s3a-2 with the wavelength $\lambda$3 has same optical power p3 in the time direction and is outputted from the SOA 5a.

However, when these optical packet signals with the wavelengths $\lambda$1 through $\lambda$3 are viewed in the wavelength direction, the optical packet signal s1a-1 with the wavelength $\lambda$1 has the optical power p5, the optical packet signal s2a-1 with the wavelength $\lambda$2 has the optical power p4, and the optical packet signal s3a-1 with the wavelength $\lambda$3 has the optical power p3. As the wavelength of an optical packet signal becomes longer, its optical power decreases. Each optical packet signal outputted does not have the same optical power.

Similarly, the optical packet signal s1a-2 with the wavelength $\lambda$1 has the optical power p5, the optical packet signal s2a-2 with the wavelength $\lambda$2 has the optical power p4, and the optical packet signal s3a-2 with the wavelength $\lambda$3 has the optical power p3. As the wavelength of an optical packet signal becomes longer, its optical power decreases. Each optical packet signal outputted does not have the same optical power.

As has been described, when a WDM optical packet signal including many optical packet signals with different wavelengths is inputted to the SOA 5a to exercise ALC, a gain tilt occurs as indicated in FIG. 3. That is to say, the gain is large on the short wavelength side and is small on the long wavelength side. Accordingly, signal lights which are amplified by the SOA 5a and which are outputted from the SOA 5a are in a state in which there is power deviation among the wavelengths. The power of the signal lights outputted is not constant.

Figure 4:
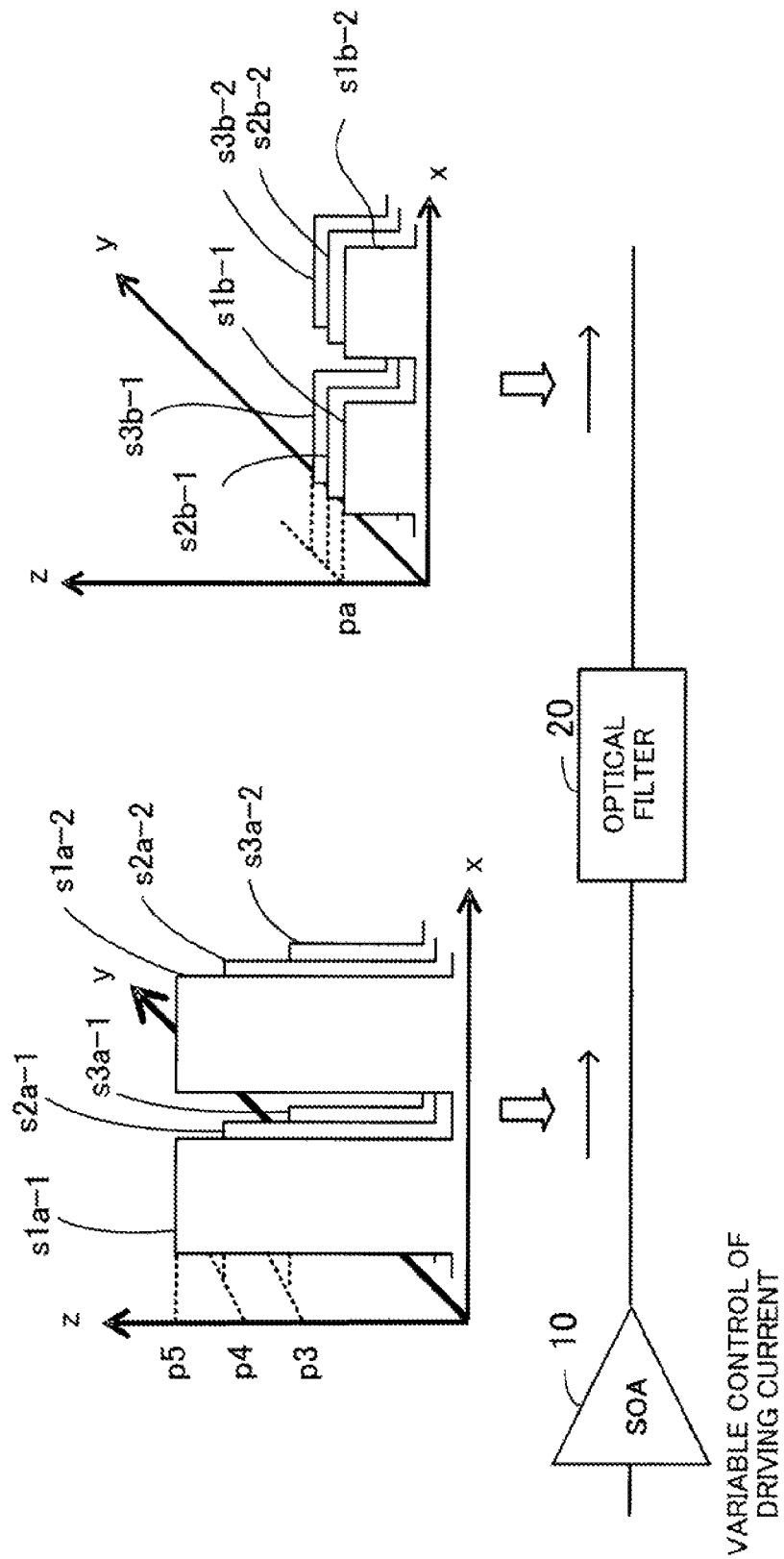
FIG. 4 illustrates filtering operation.

The optical filter 20 which compensates for a gain tilt will now be described. FIG. 4 illustrates filtering operation. In FIG. 4, an x-axis indicates time, a y-axis indicates a wavelength, and a z-axis indicates optical power.

The SOA 10 exercises ALC of a WDM signal light and an amplified WDM signal light is inputted to the optical filter 20. With this WDM signal light inputted to the optical filter 20, as indicated in FIG. 3, the optical power is constant with respect to wavelengths in the time direction and the optical power is not constant in the wavelength direction.

To be concrete, each of optical packet signals s1a-1 and s1a-2 with the wavelength $\lambda$1 has same optical power p5 in the time direction. Each of optical packet signals s2a-1 and s2a-2 with the wavelength $\lambda$2 has same optical power p4 in the time direction. Each of optical packet signals s3a-1 and s3a-2 with the wavelength $\lambda$3 has same optical power p3 in the time direction.

The optical packet signal s1a-1 with the wavelength $\lambda$1, the optical packet signal s2a-1 with the wavelength $\lambda$2, and the optical packet signal s3a-1 with the wavelength $\lambda$3 have the optical power p5, p4, and p3, respectively, in the wavelength direction and differ in optical power.

Furthermore, the optical packet signal s1a-2 with the wavelength $\lambda$1, the optical packet signal s2a-2 with the wavelength $\lambda$2, and the optical packet signal s3a-2 with the wavelength $\lambda$3 have the optical power p5, p4, and p3, respectively, in the wavelength direction and differ in optical power.

The optical filter 20 has a transmission characteristic which compensates for a gain tilt which occurs in the above WDM signal light inputted. A gain tilt occurs in the SOA 10. That is to say, its gain is large on the short wavelength side and is small on the long wavelength side. Accordingly, the optical filter 20 has the following transmission characteristic. The optical filter 20 has lower optical packet signal transmittance on the shorter wavelength side to reduce optical power.

For example, transmittance for the optical packet signals s3a-1 and s3a-2 with the wavelength $\lambda$3 is set to a determined value (90%, for example) and optical packet signals s3b-1 and s3b-2 are outputted.

Transmittance for the optical packet signals s2a-1 and s2a-2 with the wavelength $\lambda$2 is decreased (to 80%, for example) at filtering time so as to make the optical power level of optical packet signals s2b-1 and s2b-2 outputted equal to that of the optical packet signals s3b-1 and s3b-2.

In addition, transmittance for the optical packet signals s1a-1 and s1a-2 with the wavelength $\lambda$1 is decreased further (to 70%, for example) at filtering time so as to make the optical power level of optical packet signals s1b-1 and s1b-2 outputted equal to that of the optical packet signals s3b-1 and s3b-2.

As described above, filtering for compensating the gain tilt which occurs in the SOA 10 is performed by the use of a transmission characteristic reverse to the gain tilt. By doing so, a WDM signal light in which the optical packet signals are equal in optical power both in the time direction and in the wavelength direction can be outputted from the optical filter 20.

As has been described, the optical amplification apparatus 1 includes the optical filter 20 having a transmission characteristic for compensating for the gain tilt in the wavelength direction which occurs in the SOA 10 at the time of ALC of a WDM signal light inputted. The optical filter 20 performs filtering of a WDM signal light outputted from the SOA 10. As a result, power deviation among wavelengths in a WDM signal light outputted from the SOA 10 can be controlled and optical communication quality can be improved.

An optical amplification apparatus realized by further placing an SOA (rear-stage semiconductor optical amplifier) at the output stage of the optical filter 20 in the optical amplification apparatus 1 will now be described.

Figure 5:
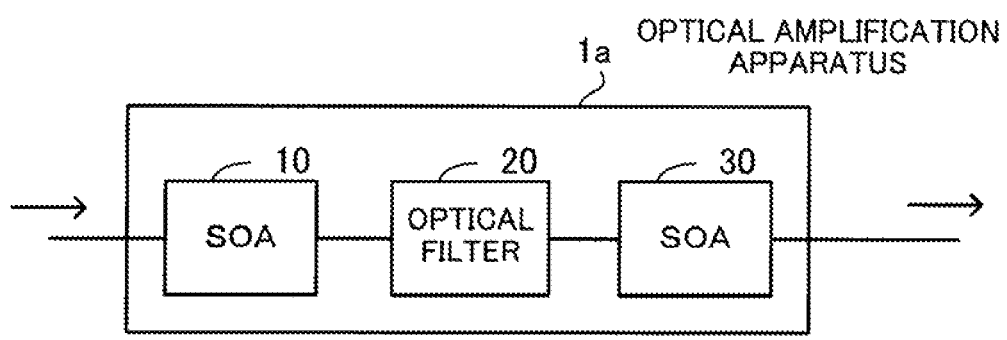
FIG. 5 is an example of the structure of an optical amplification apparatus.

FIG. 5 is an example of the structure of an optical amplification apparatus. An optical amplification apparatus 1a includes SOAs 10 and 30 and an optical filter 20. The SOAs 10 and 30 are connected in series and the optical filter 20 is placed between the SOAs 10 and 30. The SOA 10 is the same as the SOA 10 illustrated in FIG. 1. The optical filter 20 has a transmission characteristic which is the product (or the sum of transmission characteristics expressed in dB) of a transmission characteristic which compensates for a gain tilt in the wavelength direction that occurs in the SOA 10 and a transmission characteristic which compensates in advance for a gain tilt in the wavelength direction that occurs in the SOA 30. The SOA 30 amplifies a transmitted light outputted from the optical filter 20.

In the optical amplification apparatus 1a the SOA 10 at the front stage variably controls the value of driving current and exercises ALC. In addition, the SOA 30 at the rear stage controls driving current the value of which is constant, and exercises AGC (Auto Gain Control) of a transmitted light outputted from the optical filter 20. Furthermore, the SOA 30 exercises on-off switching control of driving current the value of which is constant. By doing so, the SOA 30 performs gate switching of a signal light amplified at constant gain (details of the structure and operation of the optical amplification apparatus 1a will be described later).

Gate switching means switching operation as an optical gate which turns on or off a light. An SOA amplifies and outputs a light at the time of a gate being on. An SOA shuts out a light almost completely at the time of a gate being off.

Figure 6:
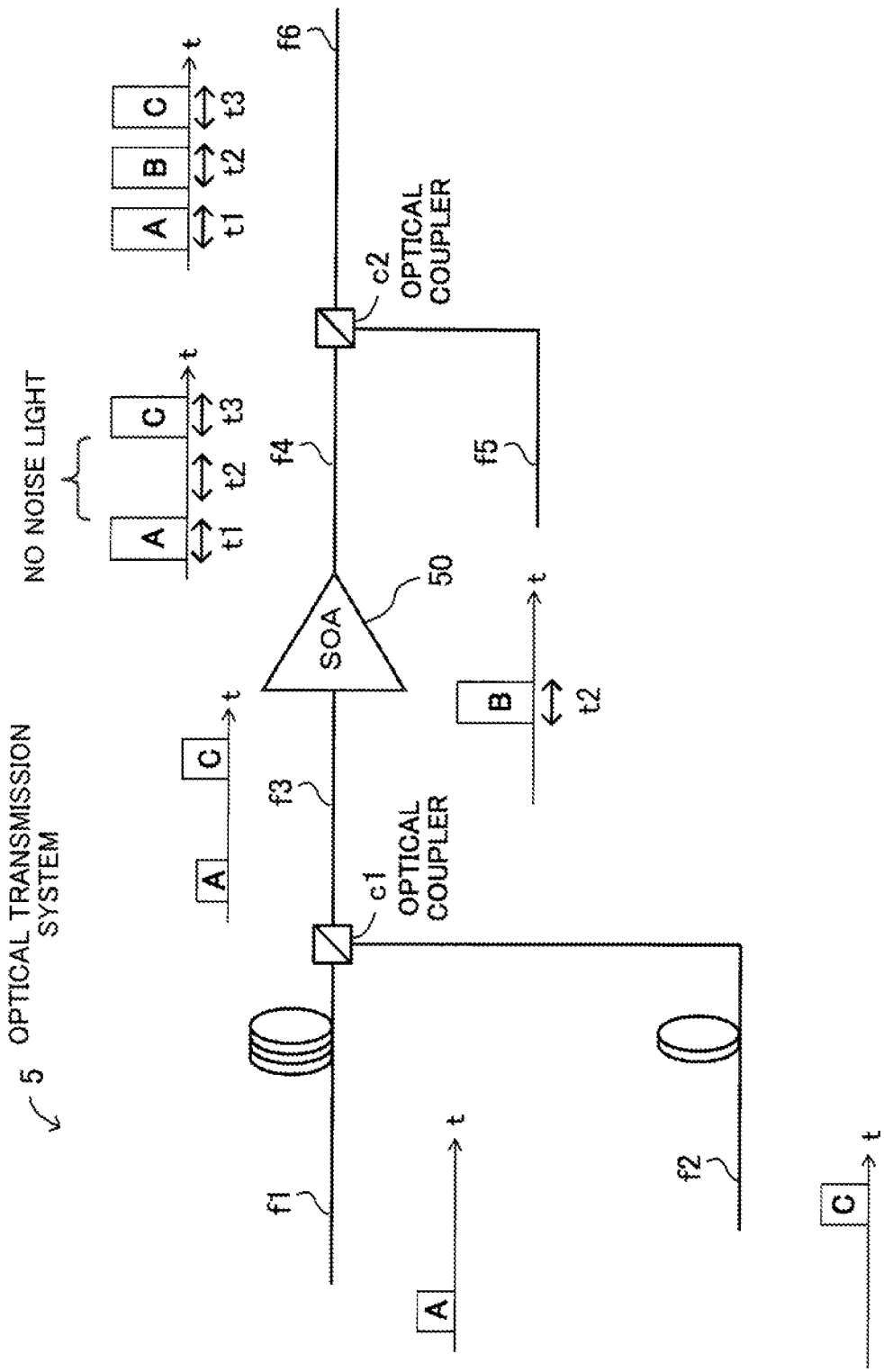
FIG. 6 illustrates optical packet signal multiplex transmission.

Gate switching will now be described with an optical transmission system as an example. FIG. 6 illustrates optical packet signal multiplex transmission. An optical transmission system 5 includes an SOA 50 and optical couplers c1 and c2. The optical transmission system 5 is applied to, for example, uplink signal transmission in an optical access system such as a PON (Passive Optical Network).

Each of the optical couplers c1 and c2 is an optical coupler with two inputs and one output. One input terminal of the optical coupler c1 is connected to an optical fiber f1 and the other input terminal of the optical coupler c1 is connected to an optical fiber f2. An output terminal of the optical coupler c1 is connected to an input terminal of the SOA 50 via an optical fiber f3.

In addition, one input terminal of the optical coupler c2 is connected to an output terminal of the SOA 50 via an optical fiber f4 and the other input terminal of the optical coupler c2 is connected to an optical fiber f5. An output terminal of the optical coupler c2 is connected to an optical fiber f6.

An optical packet signal A flows along the optical fiber f1. An optical packet signal C flows along the optical fiber f2. The optical packet signals A and C arrive at the optical coupler c1 in different time periods. The optical coupler c1 combines and outputs the optical packet signals A and C. The SOA 50 exercises ALC of the optical packet signals A and C outputted from the optical coupler c1 to amplify them to certain levels, and outputs them. It is assumed that in this case, the SOA 50 performs optical gate switching to output the optical packet signal A in a time period t1 and output the optical packet signal C in a time period t3.

The optical coupler c2 receives in the time period t1 the amplified optical packet signal A which flows along the optical fiber f4, and receives in the time period t3 the amplified optical packet signal C which flows along the optical fiber f4.

Furthermore, the optical coupler c2 receives in a time period t2 an optical packet signal B which flows along the optical fiber f5. The optical coupler c2 then combines the optical packet signals A, B, and C received in the time periods t1, t2, and t3, respectively, and outputs them.

In the above optical gate switching by the SOA 50, a gate turns on in the time periods t1 and t3 and the amplified optical packet signals A and C are outputted. The gate turns off in the time period t2.

The optical coupler c2 inserts the optical packet signal B in the time period t2. As a result, the optical packet signals A, B, and C are combined in the time periods t1, t2, and t3, respectively, and a multiplex signal is generated.

The optical coupler c2 adds the optical packet signal B in the time period t2, so it is desirable that an extinction ratio for output from the SOA 50 be high in the time period t2. That is to say, in the time periods t1 and t3, the gate turns on and a determined level of optical power is outputted. In the time period t2 in which the optical packet signal B is added, however, the gate turns off. In this time period it is important that a noise light should not be outputted from the SOA 50 (hardly any noise light be outputted to satisfy determined quality).

The reason for this is that if a noise light, such as an ASE (Amplified Spontaneous Emission), is outputted from the SOA 50 in the time period t2, it interferes with the optical packet signal B to be added.

With gate switching by an SOA, as described above, it is important that an extinction ratio (ratio of the average of the optical intensity of the signals "1" and "0" at the time of a gate being on to the average of the optical intensity of the signals "1" and "0" at the time of the gate being off) be high. As an extinction ratio becomes higher, whether a light is on or off can be determined more clearly. As a result, crosstalk caused by a signal light from another port is prevented and a code error rate decreases.

In addition to the structure and the like of an SOA, a time delay in supplying determined driving current to the SOA after the generation of applied voltage will now be described step by step by the use of FIGS. 7 through 10.

Figure 7:
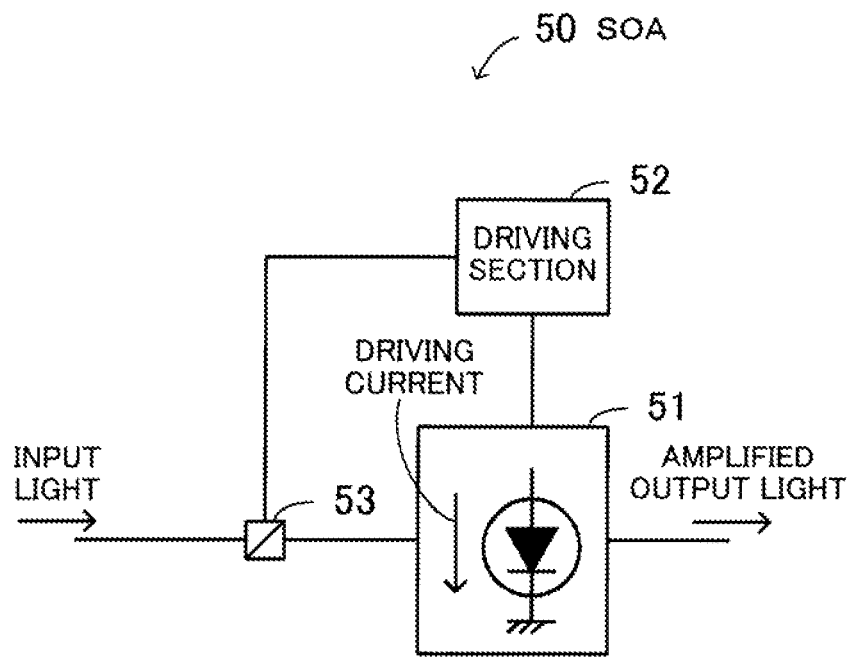
FIG. 7 illustrates the internal structure of an SOA.

FIG. 7 illustrates the internal structure of an SOA. An SOA 50 includes an optical amplification element (hereinafter referred to as the "SOA chip") 51, a driving section 52, and an optical coupler 53.

The optical coupler 53 splits an input signal light into two signal lights, outputs one signal light to the driving section 52, and outputs the other signal light to the SOA chip 51. The driving section 52 generates applied voltage according to the optical level of the input signal light. As a result, driving current the value of which corresponds to the level of the applied voltage flows through the SOA chip 51.

The SOA chip 51 changes its gain on the basis of the value of driving current and amplifies and outputs the input signal light. That is to say, the SOA chip 51 included in the SOA 50 has an electric input terminal and optical input and output terminals, changes its gain according to the value of driving current, and performs optical amplification.

Figure 8:
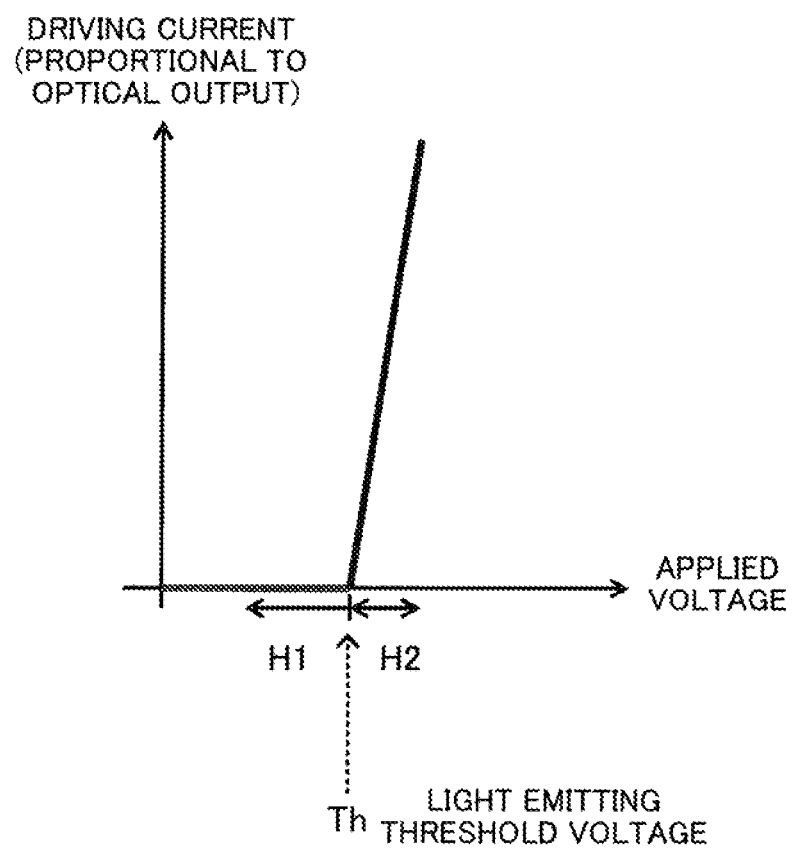
FIG. 8 indicates the voltage-current characteristic of the SOA.

FIG. 8 indicates the voltage-current characteristic of the SOA. In FIG. 8, a horizontal axis indicates applied voltage and a vertical axis indicates driving current. If the value of applied voltage is smaller than light emitting threshold voltage Th (about 0.6 V) of the SOA chip 51, that is to say, in a range H1, then a gate turns off.

If the value of applied voltage is greater than the light emitting threshold voltage Th, that is to say, in a range H2, then the gate turns on and the SOA chip 51 performs optical amplification at gain proportional to the value of driving current corresponding to the level of applied voltage.

Figure 9:
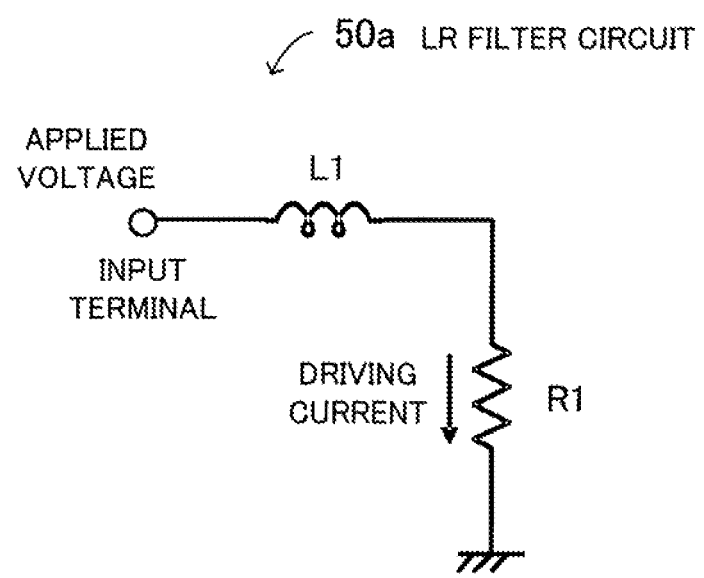
FIG. 9 illustrates an equivalent circuit of the SOA.

FIG. 9 illustrates an equivalent circuit of the SOA. The SOA 50 can be expressed by an LR filter circuit as an electric equivalent circuit. An LR filter circuit 50a includes a coil L1 and a resistor R1. One end of the coil L1 is an input terminal to which voltage is applied, and the other end of the coil L1 is connected to one end of the resistor R1. The other end of the resistor R1 is connected to GND.

With this LR filter circuit 50a there is a time delay in the flowing of determined driving current after the application of voltage. To be concrete, when applied voltage is increased from the range H1 in which voltage is lower than the light emitting threshold voltage Th to the range H2 in which voltage is higher than the light emitting threshold voltage Th, the apparent resistance value of the resistor R1 is high (few hundred kiloohms). As a result, there is a delay in reaching a determined driving current value.

Figure 10:
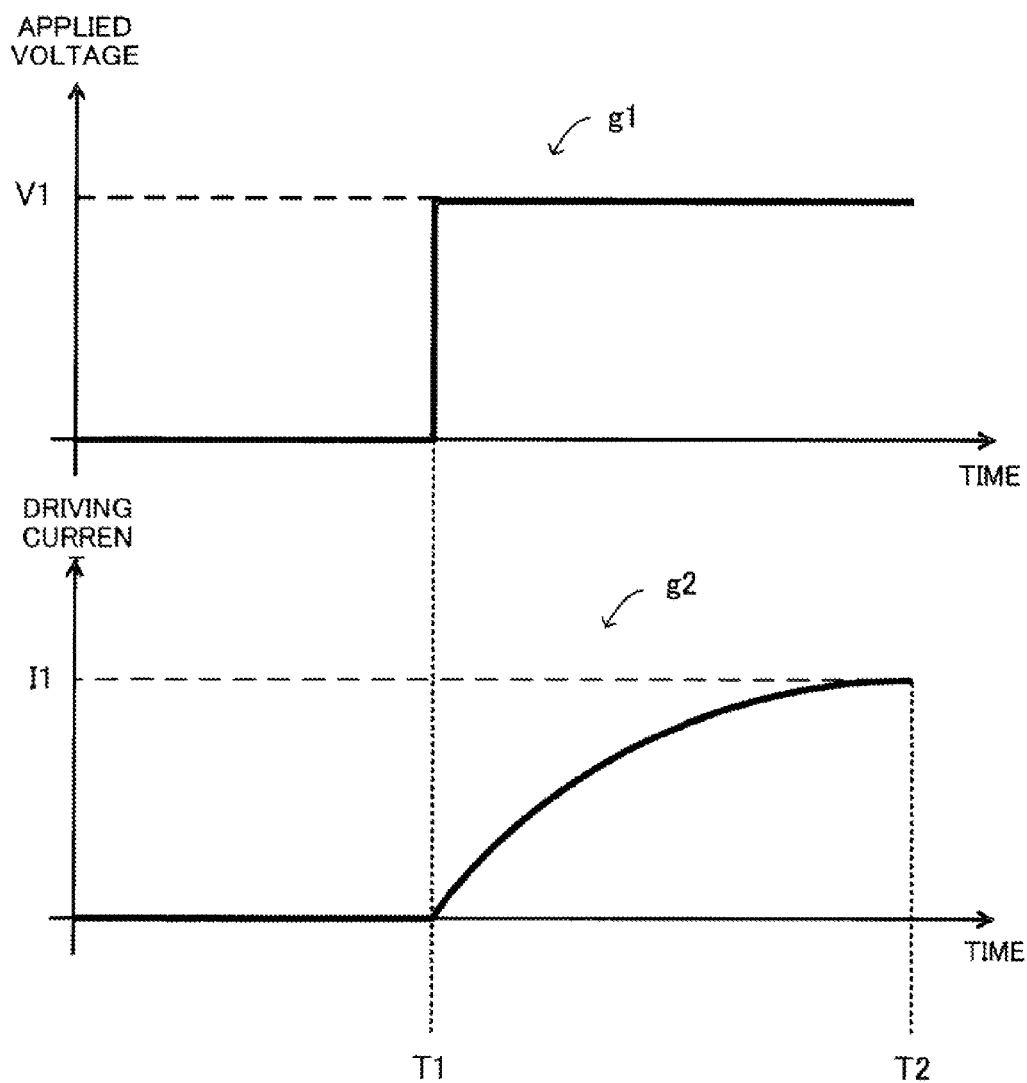
FIG. 10 indicates the correspondence between applied voltage and driving current.

FIG. 10 indicates the correspondence between applied voltage and driving current. A horizontal axis and a vertical axis for a graph g1 indicate time and applied voltage respectively. A horizontal axis and a vertical axis for a graph g2 indicate time and driving current respectively.

It is assumed that applied voltage V1 (>light emitting threshold voltage Th) is generated and that driving current I1 based on the applied voltage V1 flows to the SOA chip 51. If applied voltage changes from 0 to V1 at time T1, then applied voltage which increases from the range H1 to the range H2 is generated. The range H1 and the range H2 are indicated in FIG. 8. In this case, driving current does not instantly reach the value I1 at the time T1. Driving current reaches the desired value I1 at time T2. A delay corresponding to (T2−T1) occurs.

An edge enhancement of applied voltage will now be described by the use of FIGS. 11 through 13. As stated above, if applied voltage is increased from the range H1 in which voltage is lower than the light emitting threshold voltage Th to the range H2 in which voltage is higher than the light emitting threshold voltage Th, then there is a delay in reaching a determined driving current value. In order to reduce this delay, an edge enhancement is performed on the rising of the waveform of applied voltage. By doing so, control is exercised so as to quicken the rising of the waveform of driving current.

Figure 11:
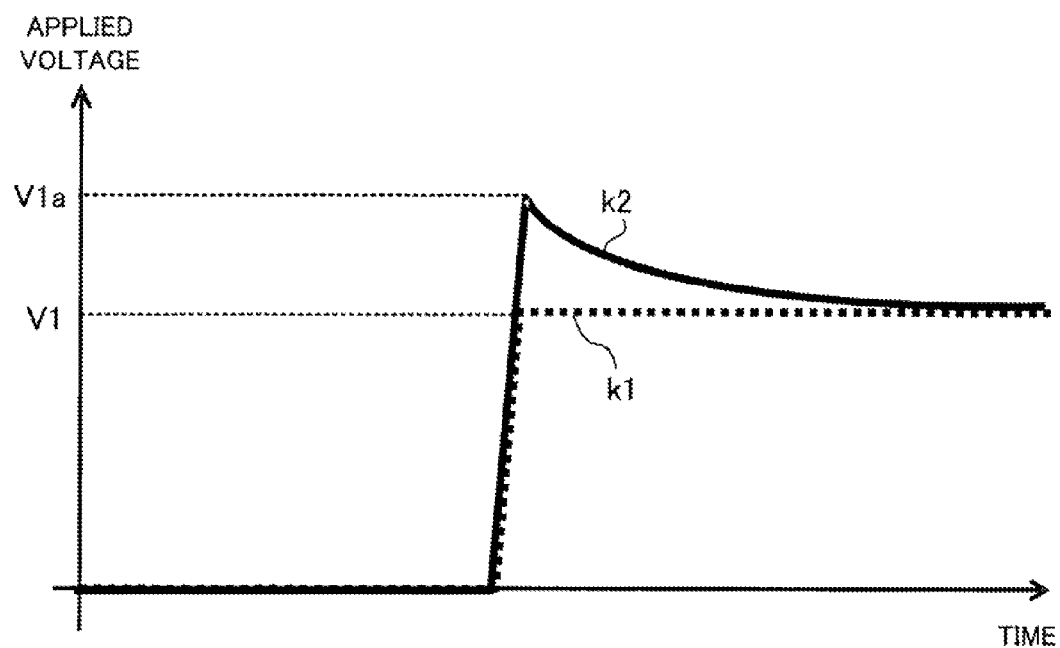
FIG. 11 indicates applied voltage after an edge enhancement.

FIG. 11 indicates applied voltage after an edge enhancement. In FIG. 11, a horizontal axis indicates time and a vertical axis indicates applied voltage. A dotted-line waveform k1 indicates applied voltage on which an edge enhancement is not performed, and a solid-line waveform k2 indicates applied voltage after an edge enhancement.

Voltage V1a which is greater than the voltage V1 is generated instantaneously at the rising of the waveform k2 indicative of applied voltage after an edge enhancement. After that, the applied voltage falls to the voltage V1 with the elapse of time and goes into a steady state at the voltage V1.

Figure 12:
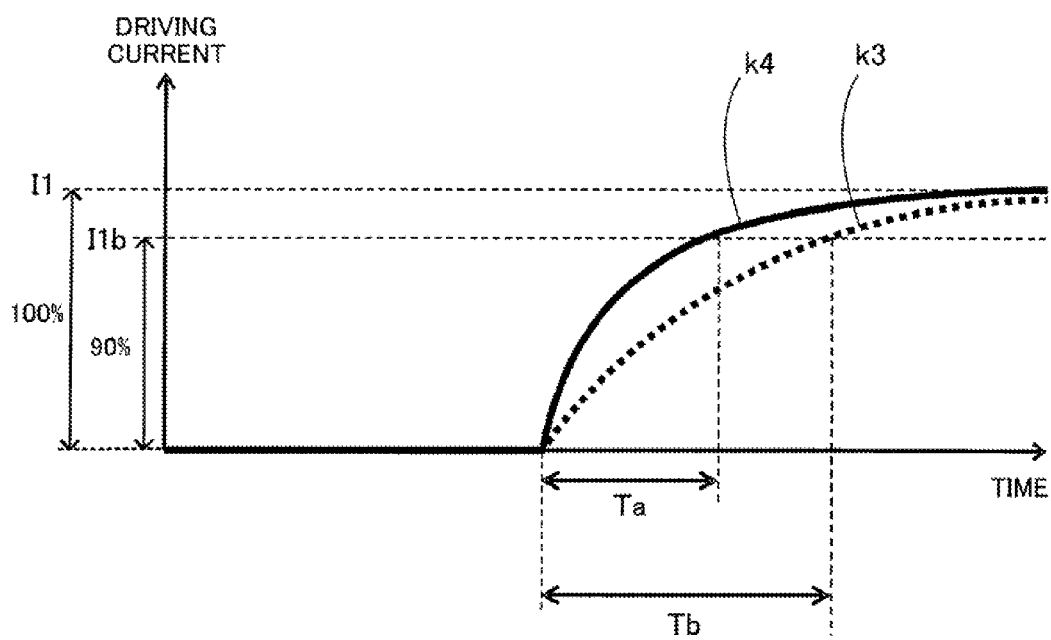
FIG. 12 indicates how driving current changes.

FIG. 12 indicates how driving current changes. In FIG. 12, a horizontal axis indicates time and a vertical axis indicates driving current. A dotted-line waveform k3 indicates driving current corresponding to applied voltage on which an edge enhancement is not performed, and a solid-line waveform k4 indicates driving current corresponding to applied voltage after an edge enhancement.

It is assumed that the steady-state value of driving current is I1 at the time of the applied voltage V1 being supplied. Furthermore, it is assumed that a current value corresponding to 90 percent of the driving current I1 is driving current I1b and that time taken for a driving current value to increase from 0 to I1b is driving current rise time.

Driving current rise time for the waveform k4 indicative of driving current corresponding to applied voltage after an edge enhancement is time Ta and driving current rise time for the waveform k3 indicative of driving current corresponding to applied voltage on which an edge enhancement is not performed is time Tb. As can be seen from FIG. 12, Ta<Tb. This means that performing an edge enhancement on applied voltage makes driving current rise time short.

Figure 13:
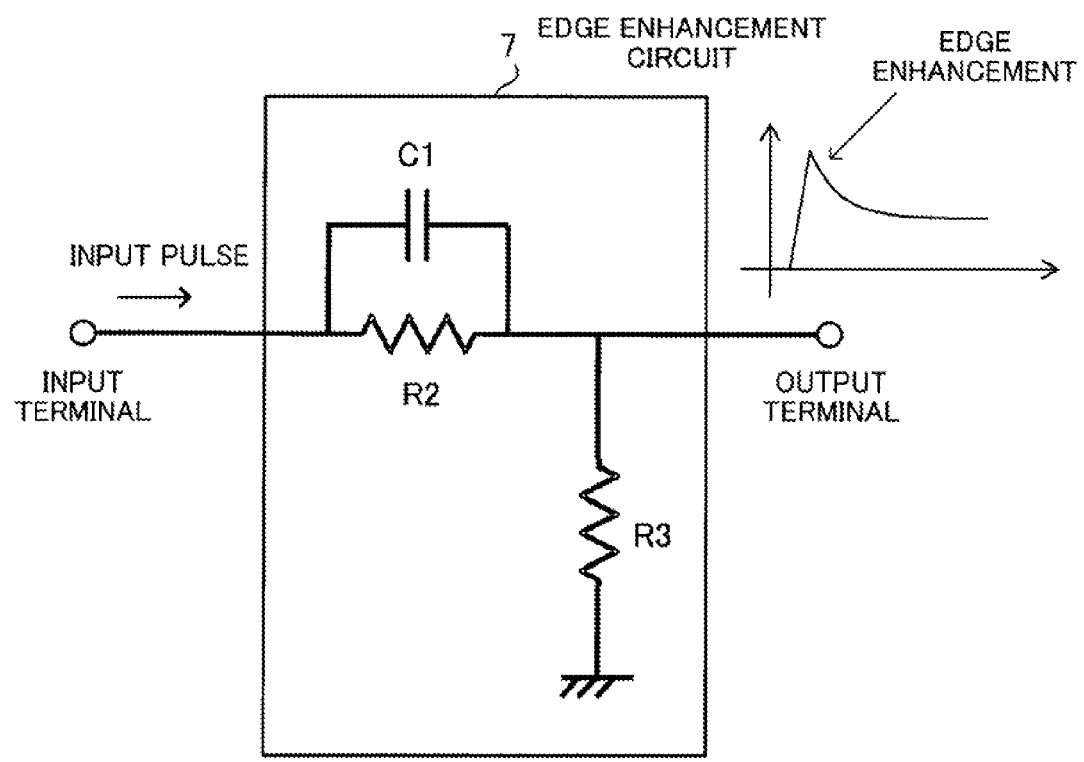
FIG. 13 is an example of the structure of an edge enhancement circuit.

FIG. 13 is an example of the structure of an edge enhancement circuit. An edge enhancement circuit 7 includes a condenser C1 and resistors R2 and R3. One end of the condenser C1 is connected to one end of the resistor R2 and an input terminal. The other end of the condenser C1 is connected to the other end of the resistor R2, one end of the resistor R3, and an output terminal. The other end of the resistor R3 is connected to GND. By adopting this circuit structure, an edge enhancement is performed on the rising of the waveform of an input pulse.

A problem with an edge enhancement will now be described by the use of FIGS. 14 and 15. If the above edge enhancement is performed on applied voltage, then an edge enhancement the size of which corresponds to a change in the power of an input light is performed.

Figure 14:
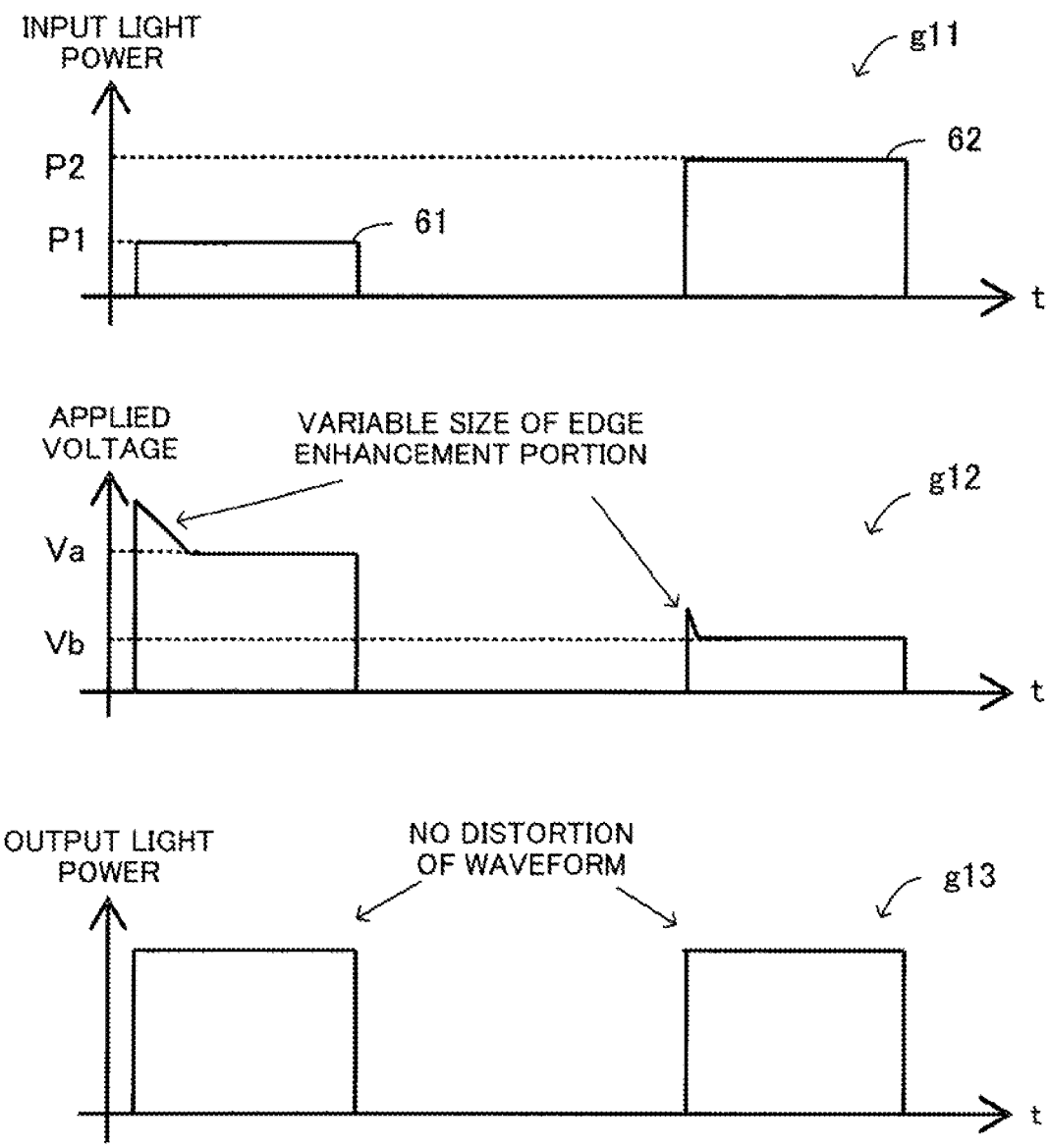
FIG. 14 illustrates an edge enhancement.

FIG. 14 illustrates an edge enhancement. Horizontal axes for graphs g11 through g13 indicate time. A vertical axis for the graph g11 indicates the power of a light inputted to an SOA. A vertical axis for the graph g12 indicates applied voltage. A vertical axis for the graph g13 indicates the power of a light outputted from the SOA. FIG. 14 indicates an ideal state in which an edge enhancement the size of which corresponds to a change in the power of a light inputted to the SOA is performed.

The rising edge of applied voltage Va and the rising edge of applied voltage Vb are enhanced. At this time the sizes of the edge enhancements correspond to optical power P1 of an optical packet signal 61 and optical power P2 of an optical packet signal 62. The optical packet signals 61 and 62 are amplified by ALC by the use of driving current generated from these applied voltages. As a result, there is no distortion of the waveforms of amplified output optical packet signals.

By changing the values of parameters (level and time constant) which change the size of an edge enhancement in this way according to the optical power of an optical packet signal, an edge enhancement is performed on applied voltage. As a result, an amplified light the optical power of which is constant and of which there is no distortion of the waveform is outputted from an SOA.

However, the edge enhancement illustrated in FIG. 14 is ideal operation. It is difficult to adaptively change the values of the edge enhancement parameters according to a change in the power of an optical packet signal.

The reason for this is as follows. As illustrated in FIG. 13, the edge enhancement circuit is a time constant circuit including the condenser and the resistors. Accordingly, it is actually difficult to switch a circuit time constant, such as a resistance value or an electrostatic capacity value, at a high speed (by the nanosecond) according to the optical power of input.

Figure 15:
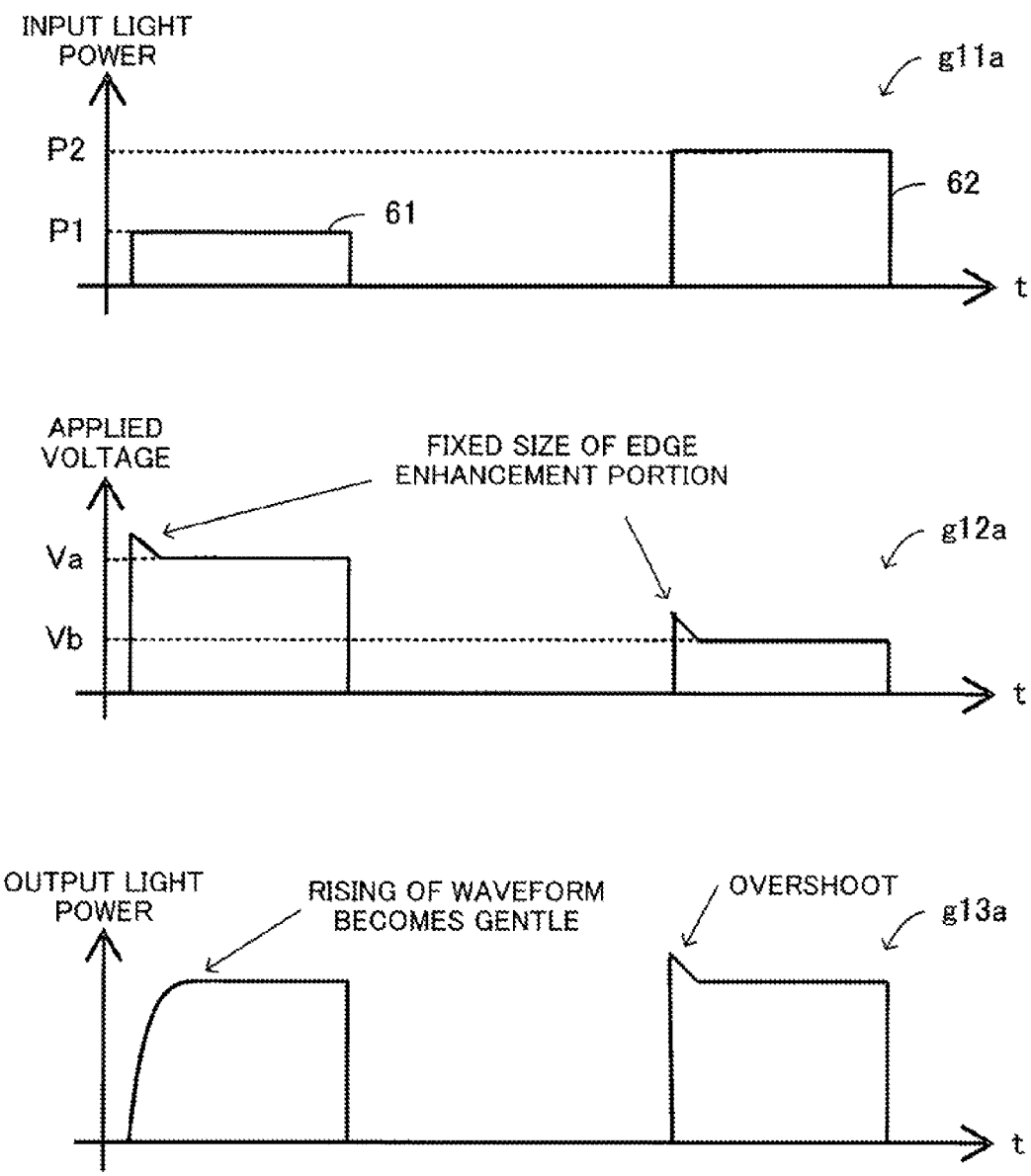
FIG. 15 illustrates an edge enhancement.

FIG. 15 illustrates an edge enhancement. Horizontal axes for graphs g11a through g13a indicate time. A vertical axis for the graph g11a indicates the power of a light inputted to an SOA. A vertical axis for the graph g12a indicates applied voltage. A vertical axis for the graph g13a indicates the power of a light outputted from the SOA. FIG. 15 indicates a state in which an edge enhancement is performed by setting the parameters (level and time constant) to fixed values regardless of a change in the power of a light inputted to the SOA.

The rising edge of applied voltage Va and the rising edge of applied voltage Vb are enhanced. At this time the sizes of the edge enhancements are fixed (average) and do not depend on optical power P1 of an optical packet signal 61 or optical power P2 of an optical packet signal 62. These fixed edge enhancements cause distortion of the waveform of an amplified light outputted from the SOA. In FIG. 15, for example, applied voltage is set to a large value at the time of exercising ALC of the optical packet signal 61 the optical power P1 of which is low. With an edge enhancement the size of which is fixed, however, an edge enhancement portion is relatively small. Accordingly, the rising of the waveform of the power of a light outputted from the SOA becomes gentle.

In addition, applied voltage is set to a small value at the time of exercising ALC of the optical packet signal 62 the optical power P2 of which is high. With an edge enhancement the size of which is fixed, however, an edge enhancement portion is relatively large. Accordingly, the rising of the waveform of the power of a light outputted from the SOA overshoots.

As has been described, an edge enhancement is performed on applied voltage at the time of optical amplification by an SOA in order to reduce a time delay in the flowing of driving current to an SOA chip after the generation of the applied voltage. However, if there is a change in the power of a light inputted to the SOA and an edge enhancement the size of which is fixed is performed on the applied voltage regardless of the change, distortion of the waveform of an amplified light outputted from the SOA occurs.

The structure and operation of the optical amplification apparatus 1a will now be described. The optical amplification apparatus 1a not only controls power deviation among wavelengths but also solves the above problem which arises at the time of an edge enhancement. By doing so, the optical amplification apparatus 1a performs fine optical gate switching.

Figure 16:
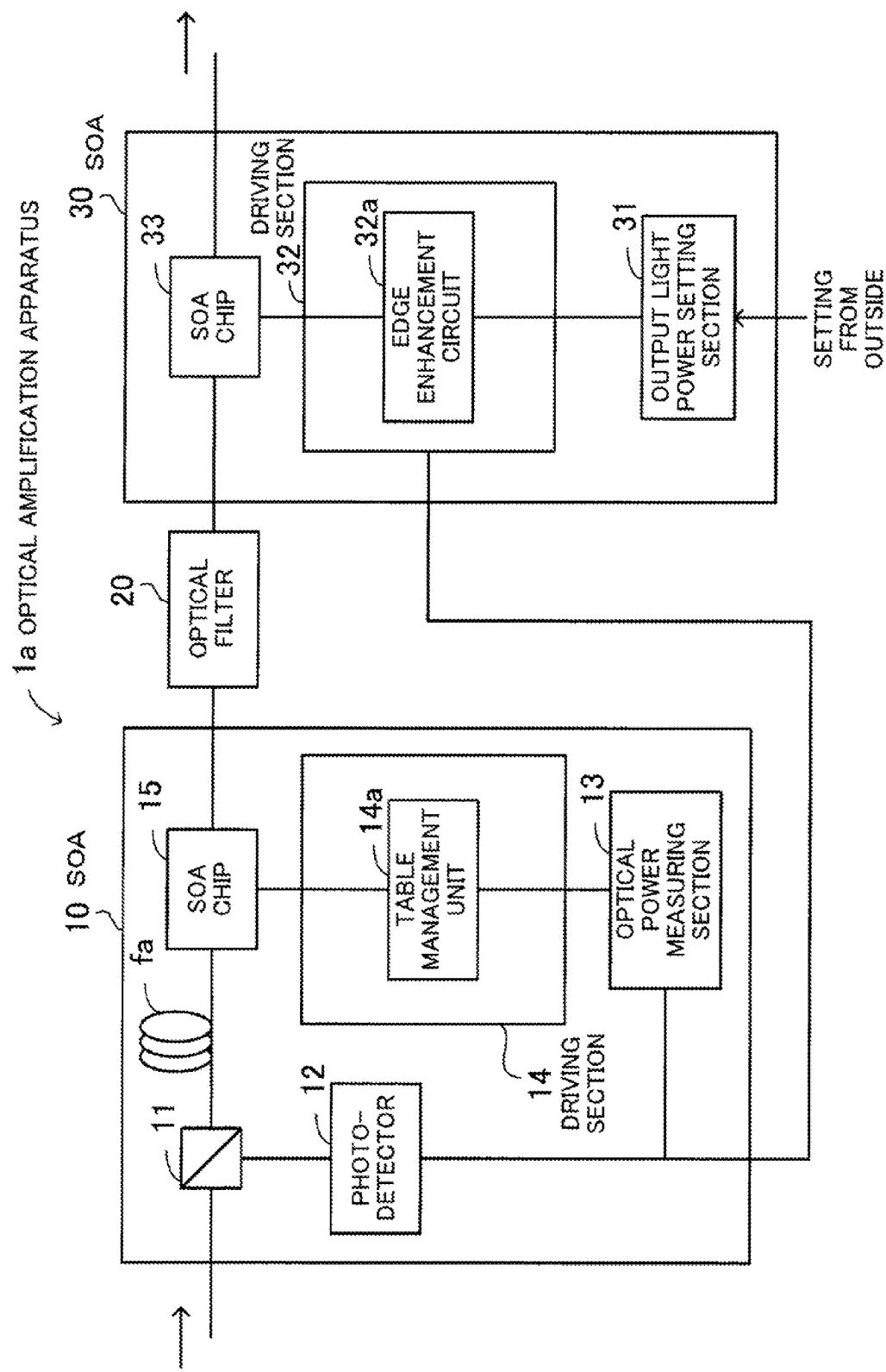
FIG. 16 is an example of the structure of the optical amplification apparatus.

FIG. 16 is an example of the structure of the optical amplification apparatus. The optical amplification apparatus 1a includes the SOAs 10 and 30 and the optical filter 20. The SOA 10 includes an optical coupler 11, a photodetector 12, an optical power measuring section 13, a driving section 14, an SOA chip 15, and an optical delay line fa and performs ALC operation. The driving section 14 includes a table management unit 14a.

The SOA 30 includes an output light power setting section 31, a driving section 32, and an SOA chip and performs AGC operation. In addition, the SOA 30 performs gate switching of a light amplified by AGC. The driving section 32 includes an edge enhancement circuit 32a.

The operation of the SOA 10 is as follows. The optical coupler 11 splits an input signal light into two signal lights, outputs one signal light to the SOA chip 15 via the optical delay line fa, and outputs the other signal light to the photodetector 12.

The photodetector 12 converts the received signal light to an electrical signal. The electrical signal is outputted to the optical power measuring section 13 and the driving section 32 included in the SOA 30. The optical power measuring section 13 measures optical power (optical peak power) corresponding to the level of the electrical signal.

The table management unit 14a manages a correspondence table indicative of the correspondence between optical power and applied voltage (contents of the correspondence table can be rewritten from the outside). On the basis of the correspondence table, the driving section 14 generates applied voltage corresponding to the optical power measured by the optical power measuring section 13. In addition, even when there is no optical input, the driving section 14 continues to generate voltage higher than light emitting threshold voltage Th.

Driving current corresponding to applied voltage flows through the SOA chip 15. The SOA chip 15 changes its gain according to driving current and amplifies the received signal light by ALC. The optical delay line fa delays the signal light by time taken to exercise control from the receiving of the signal light by the photodetector 12 to the generation of driving current.

The operation of the SOA 30 is as follows. The output light power setting section 31 sets output light power set from the outside (by a user or the like). The driving section 32 determines from the signal outputted from the photodetector 12 whether there is optical input. If there is optical input, then the driving section 32 generates applied voltage corresponding to the output light power set from the outside. If there is no optical input, then the driving section 32 outputs voltage lower than the light emitting threshold voltage Th.

Furthermore, when the driving section 32 generates applied voltage, the driving section 32 enhances the leading edge of the applied voltage by the edge enhancement circuit 32a. In this case, fixed values of the edge enhancement parameters (level and time constant) which do not depend on the optical power of input are used. Driving current corresponding to applied voltage flows through the SOA chip 33. On the basis of driving current, the SOA chip 33 performs optical gate switching of a signal light amplified at constant gain.

Figure 17:
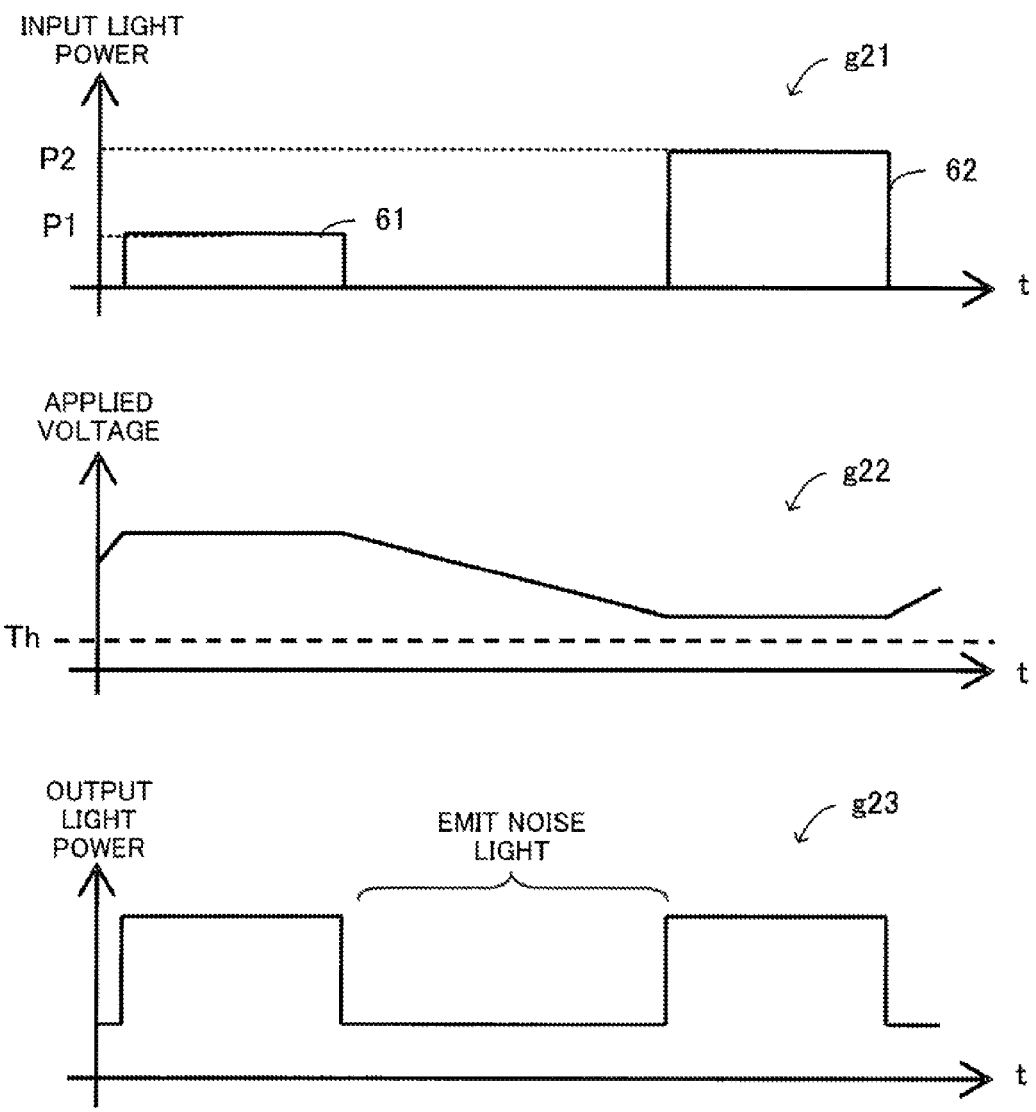
FIG. 17 illustrates ALC operation.

The ALC operation of the SOA 10 will now be described. FIG. 17 illustrates ALC operation. Horizontal axes for graphs g21 through g23 indicate time. A vertical axis for the graph g21 indicates the power of a light inputted to the SOA 10. A vertical axis for the graph g22 indicates applied voltage. A vertical axis for the graph g23 indicates the power of a light outputted from the SOA 10.

When optical packet signals 61 and 62 are inputted to the SOA 10, the SOA 10 generates applied voltages based on optical power P1 and optical power P2 and realizes desired gain. Even in a time period in which an optical packet signal is not inputted, however, the SOA generates and holds voltage higher than the light emitting threshold voltage Th. That is to say, voltage generated and held by the SOA 10 is higher than the light emitting threshold voltage Th so as not to make a gate turn off, and is lower than voltage at which the gate turns on.

As a result, the SOA 10 always generates voltage higher than the light emitting threshold voltage Th, so the SOA 10 does not exercise voltage control such as increasing voltage from a value lower than the light emitting threshold voltage Th to a value higher than the light emitting threshold voltage Th. Accordingly, the SOA 10 does not need an edge enhancement circuit. This makes it possible to reduce the scale of circuits. Even in a time period in which an optical packet signal is not inputted, however, the SOA 10 generates voltage higher than the light emitting threshold voltage Th. Therefore, the SOA 10 emits a noise light in this period.

Figure 18:
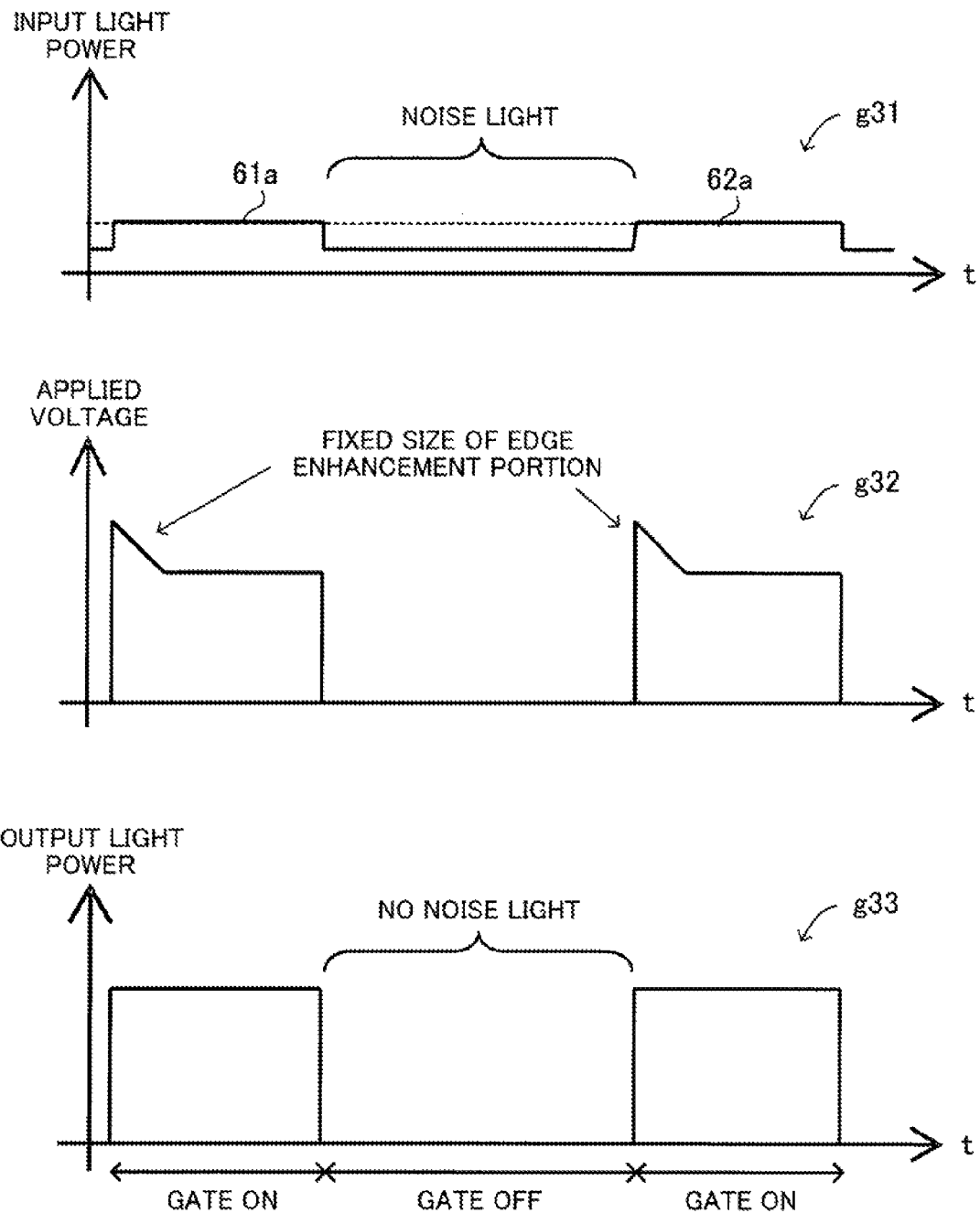
FIG. 18 illustrates gate switching operation of a light amplified by AGC.

FIG. 18 illustrates gate switching operation of a light amplified by AGC. Horizontal axes for graphs g31 through g33 indicate time. A vertical axis for the graph g31 indicates the power of a light inputted to the SOA 30. A vertical axis for the graph g32 indicates applied voltage. A vertical axis for the graph g33 indicates the power of a light outputted from the SOA 30.

Optical packet signals 61a and 62a which are equal in level in the time direction as a result of ALC operation by the SOA 10 are inputted to the SOA 30. The SOA 30 amplifies the optical packet signals 61a and 62a by AGC. In this case, the SOA 30 performs gate switching, so the SOA 30 exercises control so as to increase applied voltage from a value lower than the light emitting threshold voltage Th to a value higher than the light emitting threshold voltage Th. Accordingly, the SOA 30 includes the edge enhancement circuit.

However, the level of the optical packet signals 61a and 62a inputted to the SOA 30 is constant in the time direction as a result of ALC operation by the SOA 10. That is to say, the optical power of input to the SOA 30 is constant in the time direction in a time period in which there are optical signals, so each edge enhancement parameter (size of edge enhancement portions) may be set to a fixed value. Furthermore, the SOA 30 performs gate switching, so a noise light emitted from the SOA 10 is shut out.

As has been described in the foregoing, with the optical amplification apparatus 1a first the SOA 10 exercises ALC by variable control of driving current. In this case, the SOA 10 exercises control so as to generate voltage higher than the light emitting threshold voltage Th even in a time period in which there is no optical input. As a result, an edge enhancement circuit is unnecessary and the scale of circuits can be reduced.

Furthermore, the optical filter 20 has a transmission characteristic which is the product of a transmission characteristic which compensates for a gain tilt that occurs in the SOA 10 at the time of amplifying an input WDM signal light by ALC and a transmission characteristic which compensates in advance for a gain tilt that occurs in the SOA 30 at the time of amplification by AGC. The optical filter 20 having the above transmission characteristic performs filtering. By doing so, power deviation among wavelengths having a tilt reverse to the gain tilt which occurs in the SOA 30 at the time of amplification by AGC is produced in a light outputted from the optical filter 20. This light is inputted to the SOA 30 which performs amplification by AGC. As a result, power deviation among wavelengths in a light outputted from the SOA 30 can be controlled.

In addition, the SOA 30 controls driving current the value of which is constant, and exercises AGC. The SOA 30 exercises switching control of driving current the value of which is constant. By doing so, the SOA 30 performs gate switching of a signal light amplified by AGC. The SOA 30 performs gate switching, so it is necessary for the SOA 30 to perform an edge enhancement. However, signal lights the levels of which are constant in the time direction are outputted from the optical filter 20. Accordingly, the SOA 30 need only perform an edge enhancement by the use of fixed values of the parameters. As a result, a factor which causes distortion of the waveform of a light outputted from the SOA 30 can be eliminated.

Moreover, the SOA 10 generates voltage higher than the light emitting threshold voltage Th even in a time period in which there is no optical input. As a result, in this time period a noise light emitted from the SOA 10 is inputted to the SOA 30 via the optical filter 20. However, the SOA 30 performs gate switching at a high extinction ratio, so a noise light at the time of the gate being off can be shut out efficiently.

The optical filter 20 has a transmission characteristic which compensates for a gain tilt in the wavelength direction which occurs in each of the SOAs 10 and 30, and has the effect of controlling power deviation in the wavelength direction in a WDM signal light. However, if signal lights the levels of which are constant in the time direction are inputted to the SOA 30, the SOA 30 performs an edge enhancement by the use of fixed values of the parameters. Accordingly, the optical filter 20 is not necessarily needed for eliminating a factor which causes distortion of the waveform of an output light.

Figure 19:
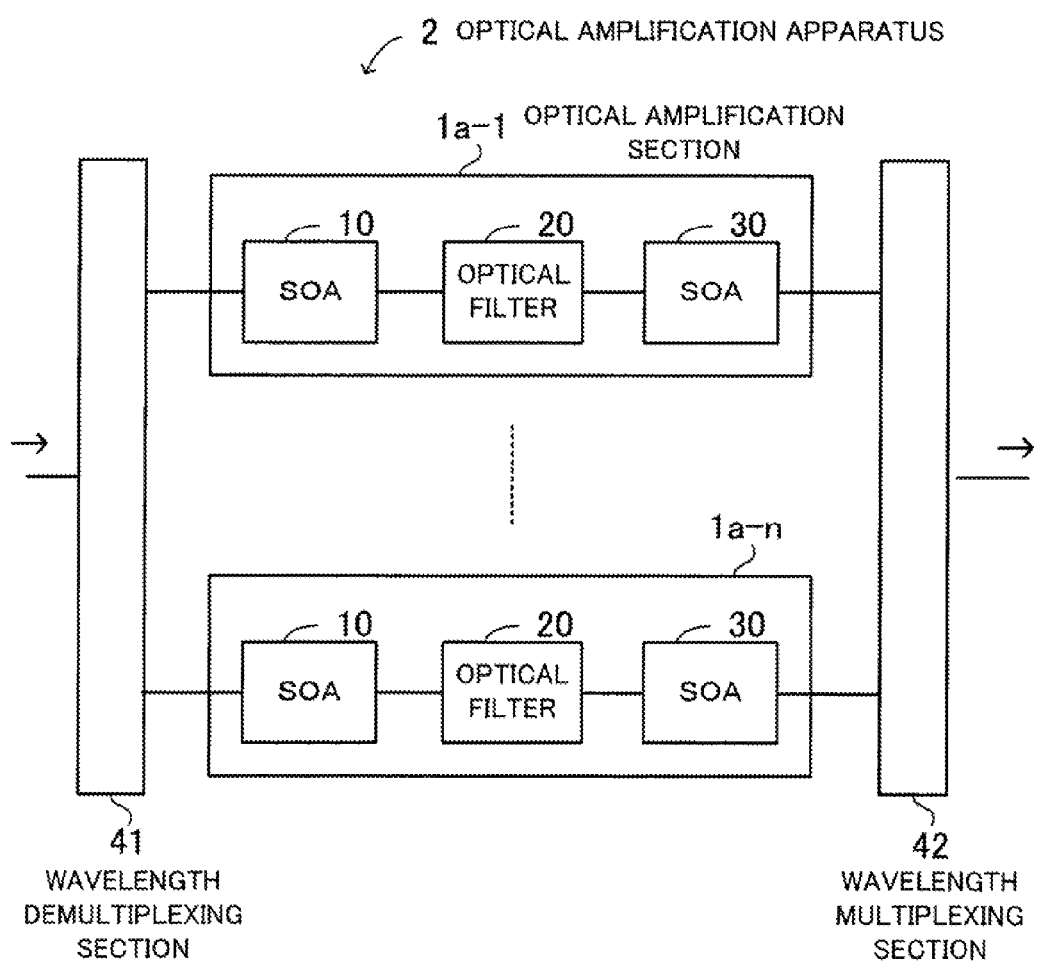
FIG. 19 is an example of the structure of an optical amplification apparatus.

The structure of an apparatus including a plurality of optical amplification apparatus 1a will now be described. FIG. 19 is an example of the structure of an optical amplification apparatus. An optical amplification apparatus 2 includes a wavelength demultiplexing section 41, a wavelength multiplexing section 42, and optical amplification sections 1a-1 through 1a-n.

The wavelength demultiplexing section 41 receives a WDM signal light, separates the WDM signal light into n signal lights with different wavelengths, and outputs the n signal lights. Each of the optical amplification sections 1a-1 through 1a-n includes SOAs 10 and 30 and an optical filter 20 and has the same internal structure that is illustrated in FIG. 16. The wavelength multiplexing section 42 combines n signal lights outputted from the n SOAs 30 included in the optical amplification sections 1a-1 through 1a-n.

A concrete example of the structure of the optical amplification apparatus 2 will now be described. It is assumed that the optical amplification apparatus 2 includes two channels (n=2), that is to say, the optical amplification sections 1a-1 and 1a-2.

Figure 20:
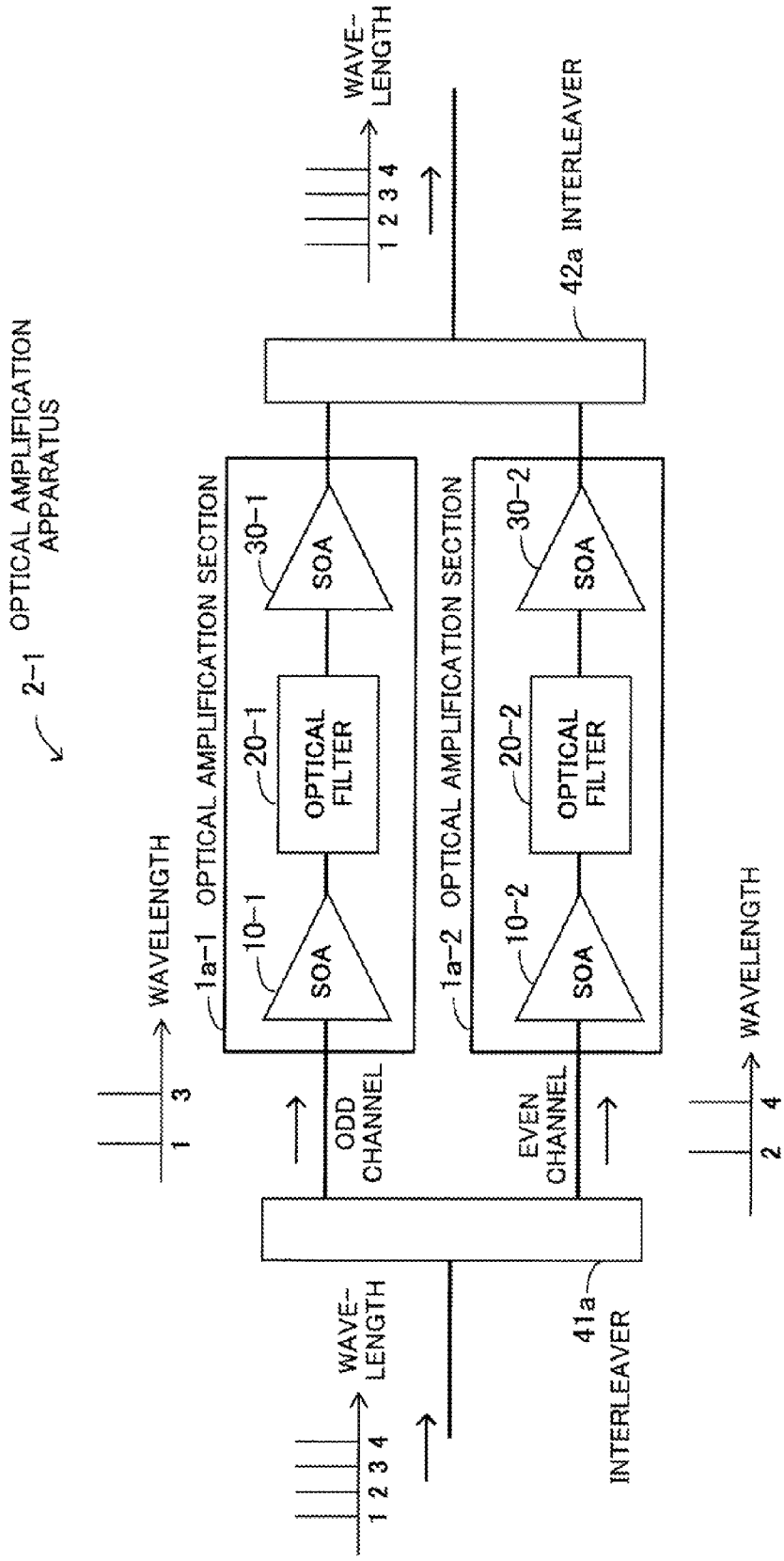
FIG. 20 is an example of the structure of an optical amplification apparatus using interleavers for wavelength demultiplexing and multiplexing.

FIG. 20 is an example of the structure of an optical amplification apparatus using interleavers for wavelength demultiplexing and multiplexing. An optical amplification apparatus 2-1 includes interleavers 41a and 42a and optical amplification sections 1a-1 and 1a-2. The optical amplification section 1a-1 includes SOAs 10-1 and 30-1 and an optical filter 20-1. The optical amplification section 1a-2 includes SOAs 10-2 and 30-2 and an optical filter 20-2.

When the interleaver 41a receives a WDM signal light, the interleaver 41a separates the WDM signal light into a signal light which contains odd channels and a signal light which contains even channels. For example, if a WDM signal light includes signal lights which contain channels ch1 through ch4, then the interleaver 41a transmits the signal light which contains the channels ch1 and ch3 to the optical amplification section 1a-1 and transmits the signal light which contains the channels ch2 and ch4 to the optical amplification section 1a-2.

Each of the optical amplification sections 1a-1 and 1a-2 exercises the above optical amplification control of the signal light inputted. The interleaver 42a combines and outputs a signal light which contains the channels ch1 and ch3 and which is amplified by the optical amplification section 1a-1 and a signal light which contains the channels ch2 and ch4 and which is amplified by the optical amplification section 1a-2.

If a WDM signal light in which signal lights with different wavelengths the spacing between which is narrow are arranged is amplified by an SOA, a light interference phenomenon, such as FWM (Four Wave Mixing), occurs and signal degradation may occur.

With the above optical amplification apparatus 2-1, on the other hand, the interleaver 41a is used for widening wavelength spacing in an input WDM signal light, and performs optical amplification of the WDM signal light by the SOAs.

As a result, the occurrence of mutual interference between adjacent wavelength channels, such as FWM, can be avoided and high quality optical amplification can be performed. The optical amplification sections 1a-1 and 1a-2 compensate for insertion losses due to the use of the interleavers 41a and 42a.

An example of the structure of an optical amplification apparatus in which WSSes (Wavelength Selective Switches) are used as the wavelength demultiplexing section 41 and the wavelength multiplexing section 42 will now be described. By using an interleaver in the above way as the wavelength demultiplexing section 41, a WDM signal light in which wavelength spacing is widened can be inputted to an SOA. As a result, the occurrence of a light interference phenomenon, such as FWM, can be avoided.

However, if a WDM signal light is separated by an interleaver into a signal light which contains odd channels and a signal light which contains even channels to widen wavelength spacing, wavelengths after the separation may be unevenly distributed depending on the arrangement of wavelength channels used in a service being used.

Figure 21:
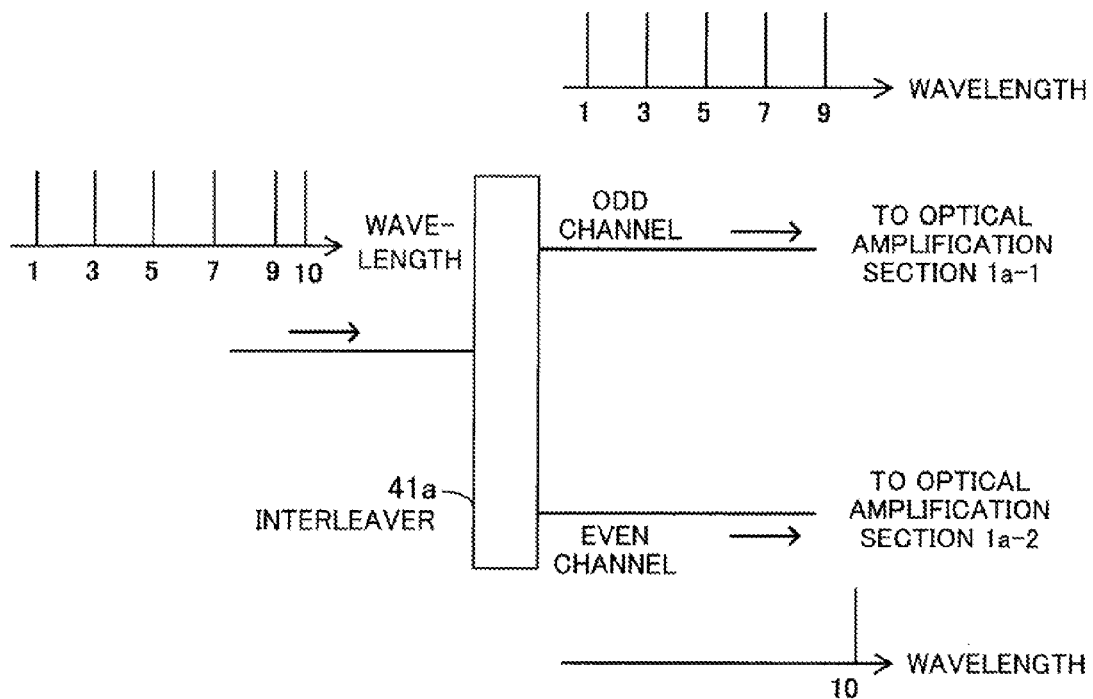
FIG. 21 indicates a state in which wavelengths are unevenly distributed.

FIG. 21 indicates a state in which wavelengths are unevenly distributed. It is assumed that a WDM signal light in which signal lights that contain channels ch1, ch3, ch5, ch7, ch9, and ch10 are combined is inputted to the interleaver 41a.

If this input is separated into a signal light which contains odd channels and a signal light which contains even channels, then the signal light which contains the channels ch1, ch3, ch5, ch7, and ch9 is transmitted to the optical amplification section 1a-1 and the signal light which contains the channel ch10 is transmitted to the optical amplification section 1a-2. Wavelengths after separation may be unevenly distributed in this way, depending on the arrangement of wavelength channels used in a service being used.

Figure 22:
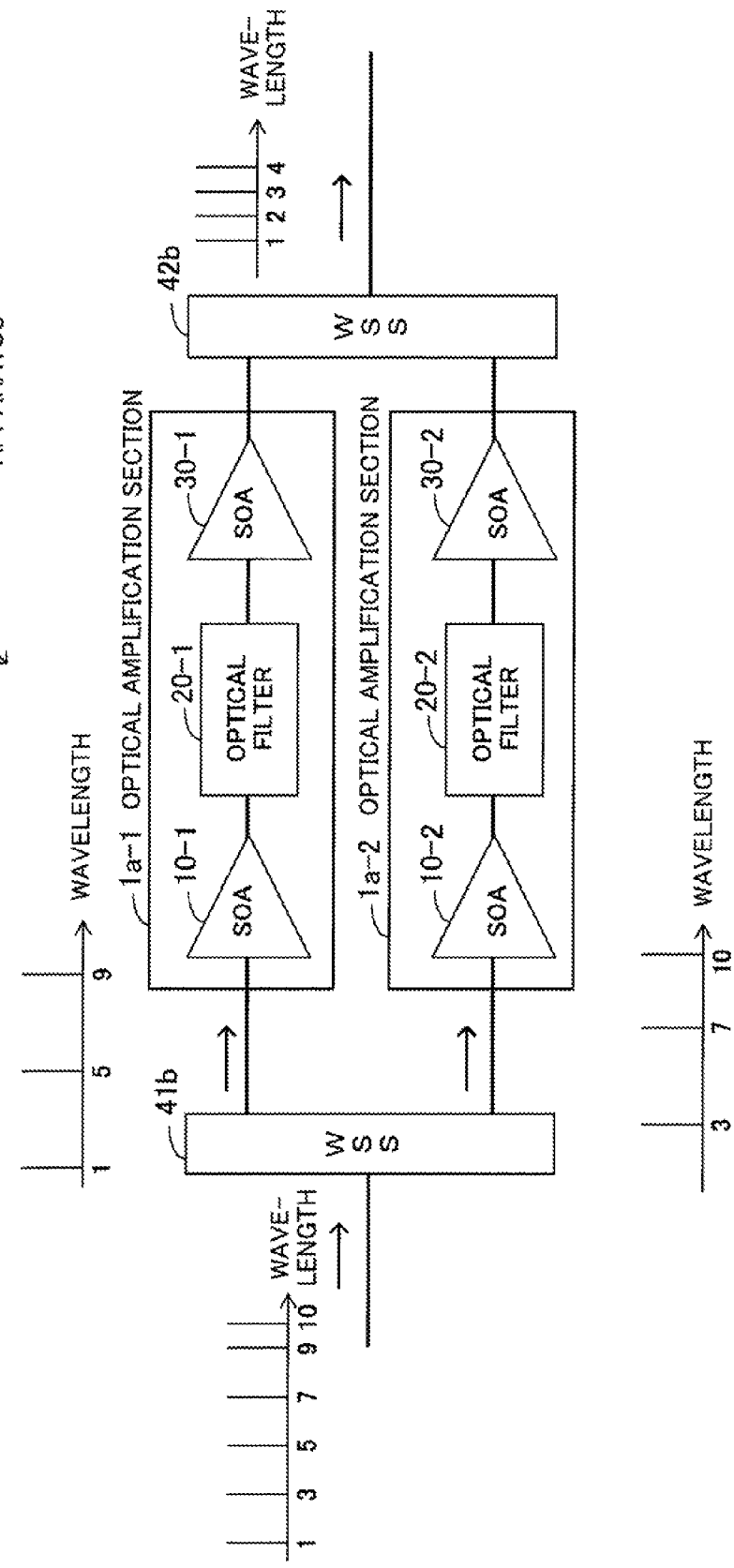
FIG. 22 is an example of the structure of an optical amplification apparatus using WSSes for wavelength demultiplexing and multiplexing.

FIG. 22 is an example of the structure of an optical amplification apparatus using WSSes for wavelength demultiplexing and multiplexing. An optical amplification apparatus 2-2 includes WSSes 41b and 42b and optical amplification sections 1a-1 and 1a-2.

When the WSS 41b receives a WDM signal light, the WSS 41b separates the WDM signal light so that the number of wavelengths will be (approximately) even (how to separate wavelengths can be set freely from the outside). For example, the WSS 41b separates a WDM signal light in which signal lights that contain channels ch1, ch3, ch5, ch7, ch9, and ch10 are combined into the signal light which contains the channels ch1, ch5, and ch9 and the signal light which contains the channels ch3, ch7, and ch10. The signal light which contains the channels ch1, ch5, and ch9 is transmitted to the optical amplification section 1a-1 and the signal light which contains the channels ch3, ch7, and ch10 is transmitted to the optical amplification section 1a-2.

Each of the optical amplification sections 1a-1 and 1a-2 performs the above optical amplification control of the signal light inputted. The WSS 42b combines and outputs a signal light which contains the channels ch1, ch5, and ch9 and which is amplified by the optical amplification section 1a-1 and a signal light which contains the channels ch3, ch7, and ch10 and which is amplified by the optical amplification section 1a-2.

By using WSSes in place of interleavers, as has been described, the number of wavelengths can be distributed evenly. The optical amplification sections 1a-1 and 1a-2 compensate for insertion losses due to the use of the WSSes 41b and 42b.

SOA integration will now be described. The SOAs 10-1 and 30-1 included in the optical amplification section 1a-1 and the SOAs 10-2 and 30-2 included in the optical amplification section 1a-2 can be integrated into one module.

Figure 23:
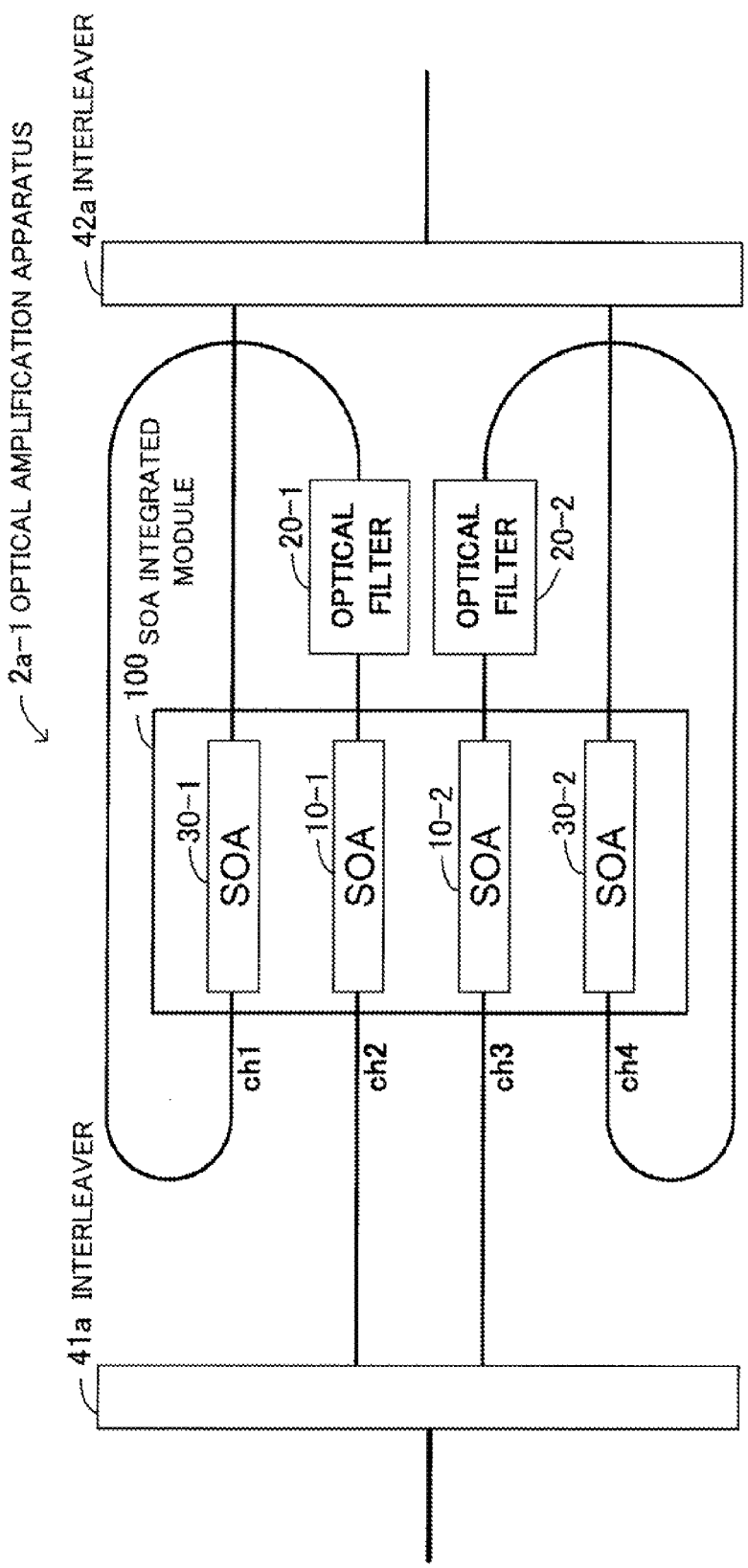
FIG. 23 illustrates SOA integration.

FIG. 23 illustrates SOA integration. A case where the SOAs 10-1, 10-2, 30-1, and 30-2 included in the optical amplification apparatus 2-1 illustrated in FIG. 20 are integrated is taken as an example of SOA integration.

An optical amplification apparatus 2a-1 includes interleavers 41a and 42a, an SOA integrated module 100, and optical filters 20-1 and 20-2.

The SOA integrated module 100 includes SOAs 10-1, 10-2, 30-1, and 30-2. The arrangement of the SOAs is as follows. The SOAs 30-1 and 30-2 each of which performs optical gate switching by on-off switching control of driving current the value of which is constant are arranged on two outer channels. The SOAs 10-1 and 10-2 each of which performs ALC operation are arranged on two inner channels.

The SOAs 30-1 and 30-2 each of which performs gate switching by exercising switching control of driving current are located in this way apart from each other. The SOAs 10-1 and 10-2 each of which performs ALC operation are located between the SOAs 30-1 and 30-2 for integration. As a result, crosstalk caused by electrical switching noise can be reduced.

In the SOAs 10-1 and 10-2 each of which performs ALC operation, a low-pass filter may be inserted between a driving section 14 and an SOA chip 15. By doing so, the influence of switching noise produced by the SOAs 30-1 and 30-2 can be reduced further.

Optical communication quality can be improved by controlling distortion of a waveform.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. An optical amplification apparatus comprising:
a front-stage semiconductor optical amplifier which amplifies an input light; and
a rear-stage semiconductor optical amplifier which amplifies an amplified light outputted from the front-stage semiconductor optical amplifier,
wherein:
the front-stage semiconductor optical amplifier exercises auto level control of an output light by exercising variable control of driving current which flows according to applied voltage higher than light emitting threshold voltage of an internal optical amplification element; and
the rear-stage semiconductor optical amplifier performs gate switching of a transmitted light by exercising switching control of driving current;
wherein the rear-stage semiconductor optical amplifier receives optical packet signals which are equal in level in the time direction as a result of the auto level control operation by the front-stage semiconductor optical amplifier;

and wherein the rear-stage semiconductor optical amplifier performs gate switching of the transmitted light at a constant gain by exercising switching control of driving current a value of which is constant and which flows according to applied voltage on which an edge enhancement is performed by the use of fixed values of parameters.

2. The optical amplification apparatus according to claim 1, further comprising an optical filter which performs filtering of the output light outputted from the front-stage semiconductor optical amplifier and which outputs the transmitted light to the rear-stage semiconductor optical amplifier, wherein:
the input light is a WDM light; and
the optical filter performs filtering of the output light outputted from the front-stage semiconductor optical amplifier by a transmission characteristic which compensates for a gain tilt in a wavelength direction that occurs at the time of the front-stage semiconductor optical amplifier exercising auto level control of the output light.

3. An optical amplification apparatus comprising:
a wavelength demultiplexing section which receives an input WDM signal light, which separates the input WDM signal light into n signal lights with different wavelengths between which spacing is widened, and which outputs the n signal lights;
n optical amplification sections each including:
a first semiconductor optical amplifier which amplifies a signal light after the separation;
an optical filter which performs filtering of an output light outputted from the first semiconductor optical amplifier at the time of the signal light after the separation being a WDM signal light by a transmission characteristic which is a product of a transmission characteristic that reduces a gain tilt in a wavelength direction that occurs at the time of the first semiconductor optical amplifier exercising auto level control of the output light and a transmission characteristic which compensates in advance for a gain tilt that occurs in a second semiconductor optical amplifier; and
the second semiconductor optical amplifier which amplifies a transmitted light outputted from the optical filter, and
a wavelength multiplexing section which combines n signal lights outputted from the n second semiconductor optical amplifiers;
wherein the second semiconductor optical amplifier receives optical packet signals which are equal in level in the time direction as a result of the auto level control operation by the first semiconductor optical amplifier;
and wherein the second semiconductor optical amplifier performs gate switching of a signal light amplified at a constant gain by exercising switching control of driving current a value of which is constant and which flows according to applied voltage on which an edge enhancement is performed by the use of fixed values of parameters.

4. The optical amplification apparatus according to claim 3, wherein the first semiconductor optical amplifier exercises auto level control of the signal light by exercising variable control of driving current which flows according to applied voltage higher than light emitting threshold voltage of an internal optical amplification element.

5. The optical amplification apparatus according to claim 3, wherein the wavelength demultiplexing section performs the separation by the use of an interleaver.

6. The optical amplification apparatus according to claim 3, wherein the wavelength demultiplexing section performs the separation by the use of a wavelength selective switch.

7. The optical amplification apparatus according to claim 3, wherein the first semiconductor optical amplifiers and the second semiconductor optical amplifiers are integrated by arranging the first semiconductor optical amplifiers between the second semiconductor optical amplifiers.

* * * * *